(12) United States Patent
Katayama

(10) Patent No.: US 7,929,712 B2
(45) Date of Patent: Apr. 19, 2011

(54) ELECTRONIC VOLUME CONTROL APPARATUS

(75) Inventor: Mutsumi Katayama, Saitama (JP)

(73) Assignee: Honda Motor Co., Ltd., Tokyo (JP)

( * ) Notice: Subject to any disclaimer, the term of this patent is extended or adjusted under 35 U.S.C. 154(b) by 1308 days.

(21) Appl. No.: 11/224,923

(22) Filed: Sep. 14, 2005

(65) Prior Publication Data

US 2006/0067543 A1    Mar. 30, 2006

(30) Foreign Application Priority Data

Sep. 29, 2004  (JP) .................. 2004-284910

(51) Int. Cl.
*H03G 3/00*    (2006.01)
(52) U.S. Cl. .................. 381/104; 381/105; 455/420
(58) Field of Classification Search .................. 381/102, 381/104–109, 180, 311, 56, 59, 86; 348/734, 348/738; 330/107, 144, 284; 455/550.1, 455/420, 430, 41.2
See application file for complete search history.

(56) References Cited

U.S. PATENT DOCUMENTS

2004/0107442 A1*  6/2004  Bayley ................... 725/93

FOREIGN PATENT DOCUMENTS

| EP | 1401110 A3 | 3/2005 |
| JP | 3088109 U | 9/1991 |
| JP | 5-308230 A | 11/1993 |
| JP | 2001-169367 A | 6/2001 |
| JP | 2002-264874 A | 9/2002 |
| JP | 2004-112674 A | 4/2004 |
| JP | 2004-112677 A | 4/2004 |

* cited by examiner

*Primary Examiner* — Vivian Chin
*Assistant Examiner* — Friedrich Fahnert
(74) *Attorney, Agent, or Firm* — Birch, Stewart, Kolasch & Birch, LLP

(57) ABSTRACT

An electronic volume apparatus sets an amplification factor (Gamp) of a digital potentiometer in response to a requested sound volume value (Vreq) transmitted thereto from a remote controller and sends back an actual result sound volume value (Vrep) with respect to the requested sound volume value. A coordination relationship among requested sound volume values (Vreq), actual result sound volume values (Vrep) and amplification factors (Gamp) is defined in a coordination relationship storage section. A search section searches an amplification factor (Gamp) and an actual result sound volume value (Vrep) coordinated with the requested sound volume value (Vreq) received from the remote controller from within the coordination relationship storage section. A sound volume control section controls the potentiometer based on a result of the search of the amplification factor. A responding section sends back the actual result sound volume value to the remote controller.

17 Claims, 18 Drawing Sheets

| REQUESTED SOUND VOLUME VALUE (Vreq) | SOUND VOLUME LEVEL (L) | AMPLIFICATION FACTOR (Gamp) |
|---|---|---|
| 15# | 4# | 30# |
| 14# | | |
| 13# | | 29# |
| 12# | | |
| 11# | | 28# |
| 10# | 3# | 27# |
| 9# | | 26# |
| 8# | | |
| 7# | | 25# |
| 6# | | 24# |
| 5# | 2# | 23# |
| 4# | | 22# |
| 3# | | 21# |
| 2# | | 20# |
| 1# | 1# | 19# |
| 0# | | 18# |

FIG. 5

FIRST TABLE

| Vreq | Gamp | Vrep |
|---|---|---|
| 5# | 23# | 5# |
| 4# | 22# | 4# |
| 3# | 21# | 3# |
| 2# | 20# | 2# |
| 1# | 19# | 1# |
| 0# | 18# | 0# |

SECOND TABLE

| Vreq | Gamp | Vrep |
|---|---|---|
| 10# | 27# | 10# |
| 9# | 27# | 10# |
| 8# | 26# | 8# |
| 7# | 25# | 7# |
| 6# | 24# | 6# |

THIRD TABLE

| Vreq | Gamp | Vrep |
|---|---|---|
| 15# | 30# | 15# |
| 14# | 30# | 15# |
| 13# | 30# | 15# |
| 12# | 29# | 12# |
| 11# | 28# | 11# |

FOURTH TABLE

| Vreq | Gamp | Vrep |
|---|---|---|
| 10# | 27# | 10# |
| 9# | 26# | 9# |
| 8# | 25# | 8# |
| 7# | 24# | 7# |
| 6# | 23# | 5# |

FIFTH TABLE

| Vreq | Gamp | Vrep |
|---|---|---|
| 15# | 30# | 15# |
| 14# | 29# | 14# |
| 13# | 28# | 13# |
| 12# | 27# | 10# |
| 11# | 27# | 10# |

FIG. 6

| Vp \ FLAG | F15 | F10 |
|---|---|---|
| 15# | 1 | |
| 11#~14# | TO BE MAINTAINED | 1 |
| 10# | | |
| 6#~9# | 0 | TO BE MAINTAINED |
| 0#~5# | | 0 |

FIG. 9

| THIRD TABLE | | |
|---|---|---|
| Vreq | Gamp | Vrep |
| 15# | 30# | 15# |
| 14# | 29# | 14# |
| 13# | 28# | 13# |
| 12# | 27# | 10# |
| 11# | 27# | 10# |

| SECOND TABLE | | |
|---|---|---|
| Vreq | Gamp | Vrep |
| 15# | 30# | 15# |
| 14# | 30# | 15# |
| 13# | 30# | 15# |
| 12# | 29# | 12# |
| 11# | 28# | 11# |
| 10# | 27# | 10# |
| 9# | 26# | 9# |
| 8# | 25# | 8# |
| 7# | 24# | 7# |
| 6# | 23# | 5# |

| FIRST TABLE | | |
|---|---|---|
| Vreq | Gamp | Vrep |
| 10# | 27# | 10# |
| 9# | 27# | 10# |
| 8# | 26# | 8# |
| 7# | 25# | 7# |
| 6# | 24# | 6# |
| 5# | 23# | 5# |
| 4# | 22# | 4# |
| 3# | 21# | 3# |
| 2# | 20# | 2# |
| 1# | 19# | 1# |
| 0# | 18# | 0# |

FIG. 14

| Vreq | Gamp | | | |
|---|---|---|---|---|
| | CA=0 CB=0 CC=0 | CA=1 CB=0 CC=0 | CA=1 CB=2 CC=0 | CA=1 CB=2 CC=1 |
| 15# 14# 13# 12# 11# 10# | | | 30# 29# 28# 27# | |
| | | 30# 29# 28# 27# | | 27# |
| 9# 8# 7# 6# | | 27# 26# 25# 24# | 26# 25# 24# 23# | |
| 5# 4# 3# 2# 1# 0# | | 23# 22# 21# 20# 19# 18# | | |

FIG. 18

ELECTRONIC VOLUME CONTROL APPARATUS

CROSS-REFERENCE TO RELATED APPLICATIONS

The present non-provisional application claims priority under 35 USC 119 to Japanese Patent Application No. 2004-284910 filed on Sep. 29, 2004 the entire contents thereof is hereby incorporated by reference.

BACKGROUND OF THE INVENTION

1. Field of the Invention

This invention relates to an electronic volume control apparatus which is remotely controlled by a remote controller. More particularly, to an electronic volume control apparatus which is remotely controlled based on a requested sound volume value defined according to the standard specifications of a Bluetooth.

2. Description of Background Art

A technique for remotely controlling the electronic volume incorporated in an audio terminal by operating a sound volume adjustment key provided on a remote controller is disclosed in Japanese Patent Laid-Open No. Hei 5-308230. A "+(plus)" key and a "−(minus)" key are provided as sound volume adjustment keys on the remote controller. Further, a "MUTE" key for attenuating the sound volume to the lowest level at a single stroke is sometimes provided on the remote controller.

Meanwhile, specifications for remotely controlling the sound volume of a headset for mounting on an individual's head is by means of a remote controller that is set in a Bluetooth which is worldwide communication standards. According to the specifications, 16 steps from "0#" to "15#" are prepared as sound volume adjustment steps (levels).

In sound volume adjustment between a television set and a remote controller therefor, an instruction of an absolute sound volume value is not issued from the remote controller to the television set, but a signal for relatively increasing or decreasing the sound volume at present like "to increase the sound volume level by one step" or "to decrease the sound volume by one step" is outputted. In contrast, a remote controller and an audio terminal which comply with the Bluetooth specifications communicate a sound volume value of one of 16 steps therebetween to recognize the sound volume value pointer therebetween. Then, if the "+" key 49a (as illustrated in FIG. 3) is operated once on the remote controller on which the current value of the sound volume value pointer is "8#", then "9#" which is higher by one step than the current value of the sound volume pointer is transmitted as a requested sound volume value (Vreq) from the remote controller to the audio terminal.

The audio terminal side changes the sound volume value from "8#" to "9#" and further updates the sound volume value pointer from "8#" to "9#" in response to a reception of the requested sound volume value (Vreq). Further, a notification of a result of the updating of the sound volume value pointer is issued as an actual result sound volume value (Vrep) to the remote controller. The remote controller updates the sound volume pointer from "8#" to "9#" based on the received actual result sound volume value (Vrep). Accordingly, if the "+" key 49a is thereafter operated only once on the remote controller side, then a requested sound volume value (Vreq) "10#" is transmitted from the remote controller to the audio terminal.

When the electronic volume of a headset for a driver of a vehicle is remotely controlled by a vehicle body side remote controller, if it is necessary to operate the electronic volume of the headset by use of a hand (using sound volume keys 39a, 39b, as shown in FIG. 2) with a glove positioned thereon, preferably the number of sound volume adjustment steps is decreased from 16 steps of the standard specifications to make the operation of the electronic volume simple and convenient. For example, it is preferable Japanese Patent Laid-Open No. Hei 5-308230 to decrease the number of sound volume adjustment steps, for example, to such four steps or levels (1# to 4#), as "mute," "low sound volume level for stopping," "medium sound volume level for traveling at a low or medium speed" and "high sound volume level for traveling at a high speed." At this time, in a potentiometer built for controlling electronic volume, predetermined amplification factors (attenuation factors) are allocated to the four sound volume levels (1# to 4#) using sound volume keys 39a, 39b described above.

FIG. 19 is a view illustrating a relationship among the requested sound volume value (Vreq), sound volume value level (L) and amplification factor (Gamp) of the potentiometer of the apparatus disclosed in Japanese Patent Laid-Open No. Hei 5-308230. The amplification factors (Gamp) "19#", "23#", "27#" and "30#" of the potentiometer are allocated to the sound volume levels "1#" to "4#", respectively. In addition, the requested sound volume values (Vreq) "1#", "5#" "10#" and "15#" are allocated, respectively.

At this time, between the sound volume value levels (L) "1#" and "2#", the requested sound volume values (Vreq) "1#" to "5#" and the amplification factors (Gamp) "19#" to "23#" are coordinated in a one-by-one coordination relationship. However, between the sound volume value level (L) "2#" and "3#", while the requested sound volume value (Vreq) includes six steps of "5#" to "10#", the amplification factor (Gamp) includes five steps of "23#" to "27#". Accordingly, if "5#" is transmitted as the requested sound volume value (Vreq) from the remote controller, then the audio terminal sets the amplification factor (Gamp) to "23#" and sends back "5#" as the actual result sound volume value (Vrep). Consequently, the remote controller updates the sound volume value pointer to "5#".

If such a sequence of operations as described above is repeated and "9#" is transmitted as the requested sound volume value (Vreq) from the remote controller, then the audio terminal sets the amplification factor (Gamp) to 27# and sends back 9# as the actual result sound volume value (Vrep). Thus, the remote controller updates the sound volume value pointer to "9#". Accordingly, if the "+" key 49a is operated further on the remote controller, then "10#" is transmitted as the requested sound volume value (Vreq). However, since "10#" of the requested sound volume value (Vreq) is coordinated with "27#" of the amplification factor (Gamp), although the "+" key 49a has been operated, the sound volume does not vary. Thus, with the conventional apparatus disclosed in Japanese Patent Laid-Open No. Hei 5-308230, the speaker 12 of the audio terminal does not always produce the desired sound volume.

SUMMARY AND OBJECTS OF THE INVENTION

It is an object of the present invention to solve the subject of the related art described above and provide an electronic volume control apparatus which can assure good remote controllability.

In order to attain the object described above, according to the present invention, an electronic volume control apparatus which sets an amplification factor (Gamp) of a digital potentiometer in response to a requested sound volume value (Vreq) transmitted thereto from a remote controller and sends back an actual result sound volume value (Vrep) in response to the requested sound volume value is characterized in that such measures as given below are taken.

The electronic volume control apparatus includes storage means for defining a coordination relationship among M different requested sound volume values (Vreq) and M different actual result sound volume values (Vrep) as well as N different amplification factors (Gamp). Means are provided for receiving a requested sound volume value (Vreq). Means are provided for searching an amplification factor and an actual result sound volume value coordinated with the received requested sound volume value from within the storage means. Means are provided for controlling the potentiometer based on a result of the search of the amplification factor, and responding means for sending back the result of the search of the actual result sound volume value. The storage means includes means for coordinating the mth requested sound volume value uniquely with the nth amplification factor and the mth actual result sound volume value and coordinating the [m+i]th requested sound volume value uniquely with the [n+j]th (i>j) amplification factor and the [m+i]th actual result sound volume value, ascending order coordination means for coordinating the amplification factors in an ascending order from the [n+1]th amplification factor with the [m+1]th to [m+i−1]th requested sound volume values and coordinating the actual result sound volume values in an ascending order from the [m+1]th actual result sound volume value with the [m+1]th to [m+i−1]th requested sound volume values and for uniformly coordinating the [n+j]th amplification factor and the [m+i]th actual result sound volume value with the remaining requested sound volume values. Descending order coordination means are provided for coordinating the amplification factors in a descending order from the [n+j−1]th amplification factor with the [m+i−1]th to [m+1]th requested sound volume values and coordinating the actual result sound volume values in a descending order from the [m+i−1]th actual result sound volume value with the [m+i−1]th to [m+i]th requested sound volume values and for uniformly coordinating the nth amplification factor and the mth actual result sound volume value with the remaining requested sound volume values. The search means are operable to compare, when any of the [m+1]th to [m+i−1]th requested sound volume values (Vreq) is received, a timing at which the mth actual result sound volume value is sent back last and a timing at which the [m+i]th actual result sound volume value is sent back with each other and search the ascending order coordination means if the sending back timing of the mth actual result sound volume value is newer but search the descending order coordination means if the sending back timing of the [m+i]th actual result sound volume value is newer.

The electronic volume control apparatus is characterized in that, with the remaining requested sound volume values, an actual result sound volume value having a value different from the requested sound volume value is coordinated.

The electronic volume control apparatus is characterized in that the ascending order coordination means and the descending order coordination means are data tables wherein the coordination relationships of the requested sound volume values, actual result sound volume values and amplification factors are different from each other.

The electronic volume control apparatus is characterized in that the storage means is a function whose parameters are a requested sound volume value in the present cycle, a history relating to the requested sound volume values in the preceding cycles and a set value unique to the potentiometer, and the search means determines an actual result sound volume value and an amplification factor to be coordinated with the requested sound volume value based on the function.

According to the present invention, such effects as given below are achieved.

According to an embodiment of the present invention, even if the number of steps of sound volume adjustment of the remote controller and the number of steps of sound volume adjustment of the potentiometer are different from each other, sound volume adjustment operation which does not provide an unfamiliar feeling can be anticipated.

According to an embodiment of the present invention, even if the number of steps of sound volume adjustment of the remote controller and the number of steps of sound volume adjustment of the potentiometer are different from each other, sound volume control which is accurate for sound volume operation can be anticipated.

According to an embodiment of the present invention, the load of a process for determining an actual result sound volume value and an amplification factor coordinated with a requested sound volume adjustment received from the remote controller can be reduced.

According to an embodiment of the present invention, the memory capacity necessary for determining an actual result sound volume value and an amplification factor coordinated with a requested sound volume adjustment received from the remote controller can be saved.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 5 is a view illustrating a coordination relationship among requested sound volume values Vreq, sound volume levels L and amplification factors Gamp;

FIG. 6 is a view illustrating an example of a relationship among the requested sound volume values Vreq, amplification factors Gamp and an actual result sound volume values Vrep;

FIG. 9 is a view illustrating a relationship among sound volume value pointers Vp and re-reading flags F10 and F15 in the form of a table;

FIG. 14 is a view showing a structure of data tables of a second embodiment of the present invention;

FIG. 18 is a view showing a structure of data tables of the third embodiment.

DETAILED DESCRIPTION OF THE PREFERRED EMBODIMENTS

Figure 1:
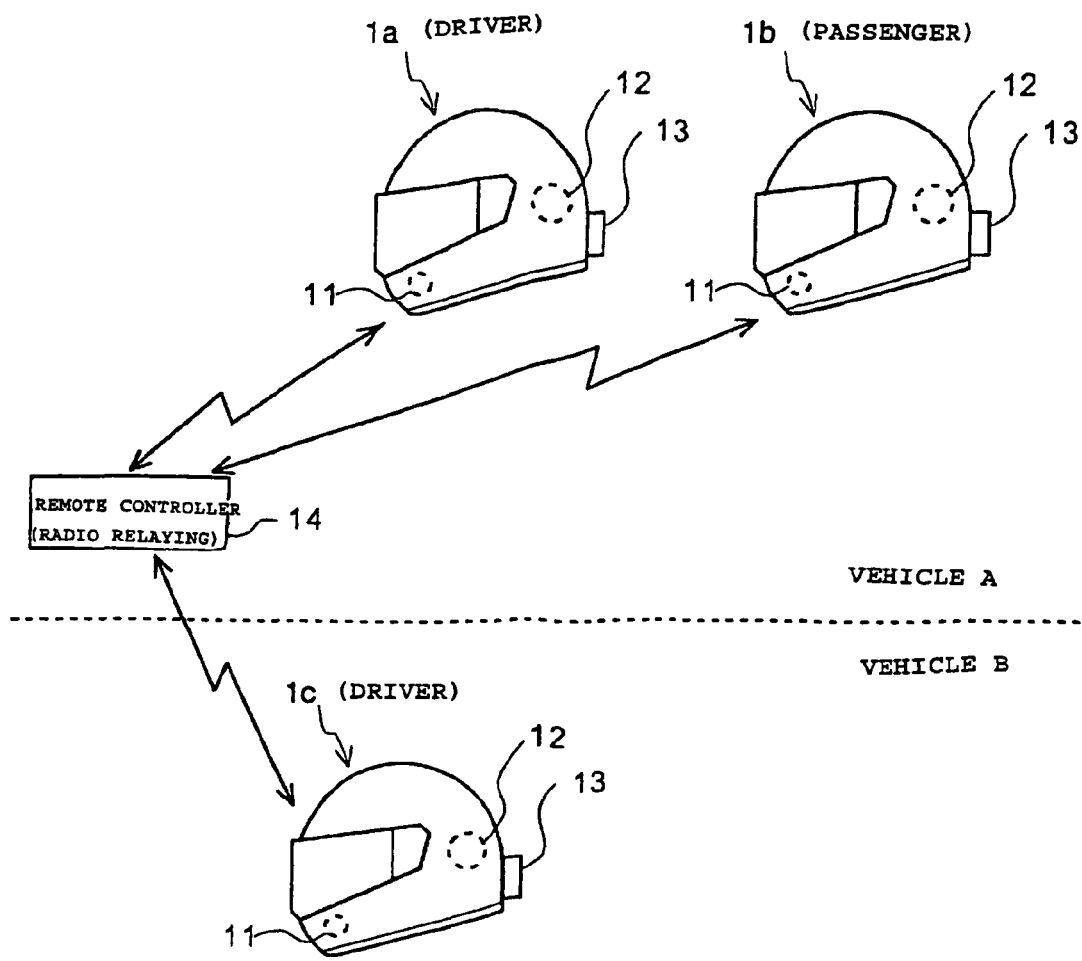
FIG. 1 is a view showing an example of a communication form by an intercom to which the present invention is applied.

In the following, a preferred embodiment of the present invention is described in detail with reference to the drawings. FIG. 1 is a view showing an example of a form of communication by an intercom to which the present invention is applied. A remote controller 14 having a radio relaying function is incorporated in a vehicle A. On each of helmets 1a, 1b and 1c which are worn by passengers of the vehicles A and B, a headset including an audio terminal 13 which adopts an electronic volume apparatus of the present invention is mounted together with a microphone 11 and a speaker 12. The remote controller 14 and the audio terminals 13 comply with the Bluetooth specifications, and on a piconet in which the remote controller 14 and the audio terminals 13 are accommodated, the remote controller 14 and the audio terminals 13 communicate with each other while the remote controller 14 operates in a master mode and the audio terminals 13 operate in a slave mode.

Figure 2:
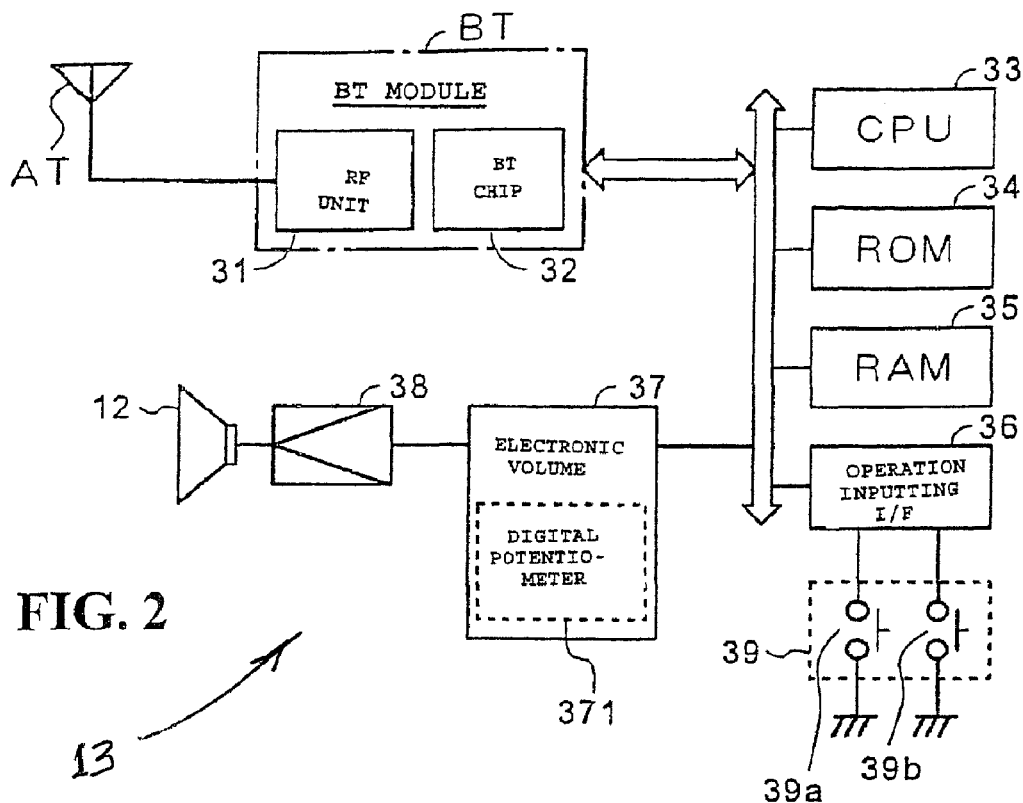
FIG. 2 is a block diagram showing a configuration of principal part of an audio terminal.

FIG. 2 is a block diagram showing a configuration of principal part of the audio terminal 13. A description of elements which are not necessary for a description of the present invention is omitted herein.

An antenna AT is connected to a Bluetooth (BT) module. A CPU 33 executes various processes in accordance with a program stored in a ROM 34. A RAM 35 provides a working area for temporarily storing data and so forth when the CPU 33 executes various processes. Various operation switches including a sound volume switch 39 and a display apparatus are connected to an interface 36. The sound volume switch 39 includes at least a "+" key 39a and a "−" key 39b for adjusting the sound volume level (L) to one of four levels (1# to 4#). An electronic volume apparatus 37 includes a digital potentiometer 371, for amplifying an input signal (is this signal one of four levels (1# to 4#) of sound volume level (L)?) with an amplification factor (Gamp) in response to the operation of the sound volume switch 39 or a requested sound volume value (Vrep) received from the remote controller 14 and outputs the amplified signal (???) to an amplifier 38, which in turn outputs a signal to speaker 12 so that speaker 12 emits a desired sound volume. (Is the correct???) The BT module includes an RF unit 31 and a BT chip 32 as principal components thereof. The BT chip 32 executes a process of establishing intra-piconet synchronism with an opposite party terminal, coding/decoding processes of transmission/reception signals and so forth.

Figure 3:
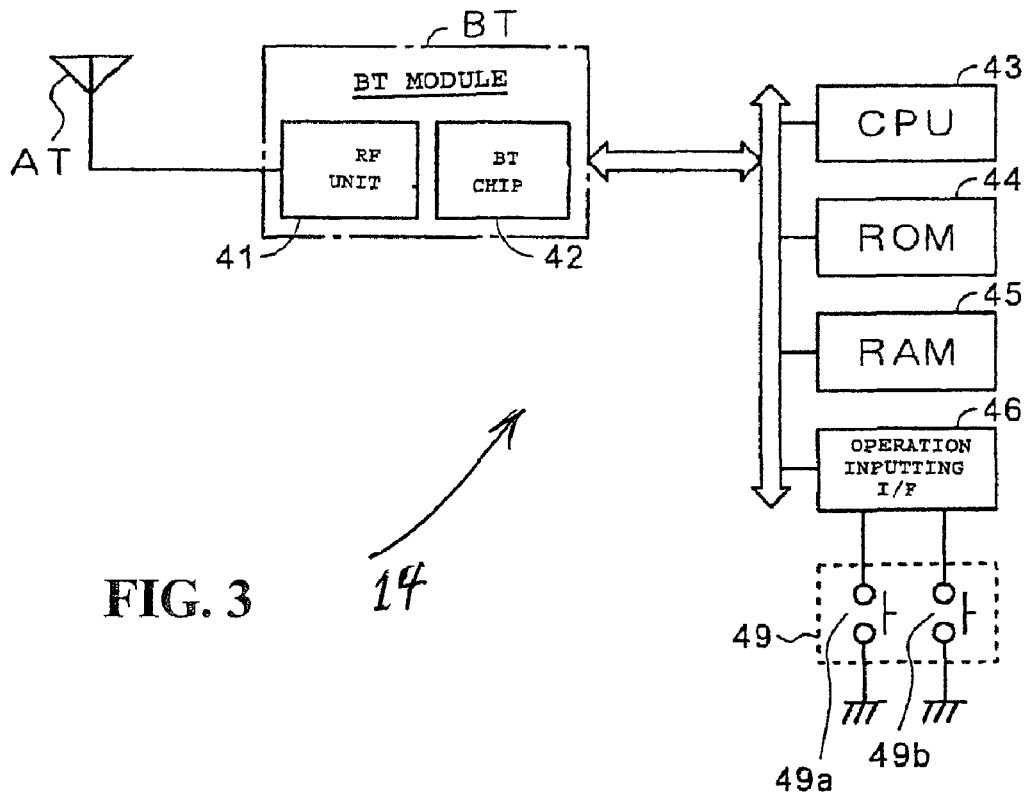
FIG. 3 is a block diagram showing a configuration of principal part of a remote controller.

FIG. 3 is a block diagram showing a configuration of principal parts of the remote controller 14. When compared with the audio terminal 13, the speaker 12, electronic volume apparatus 37 and amplifier 38 are omitted.

Figure 4:
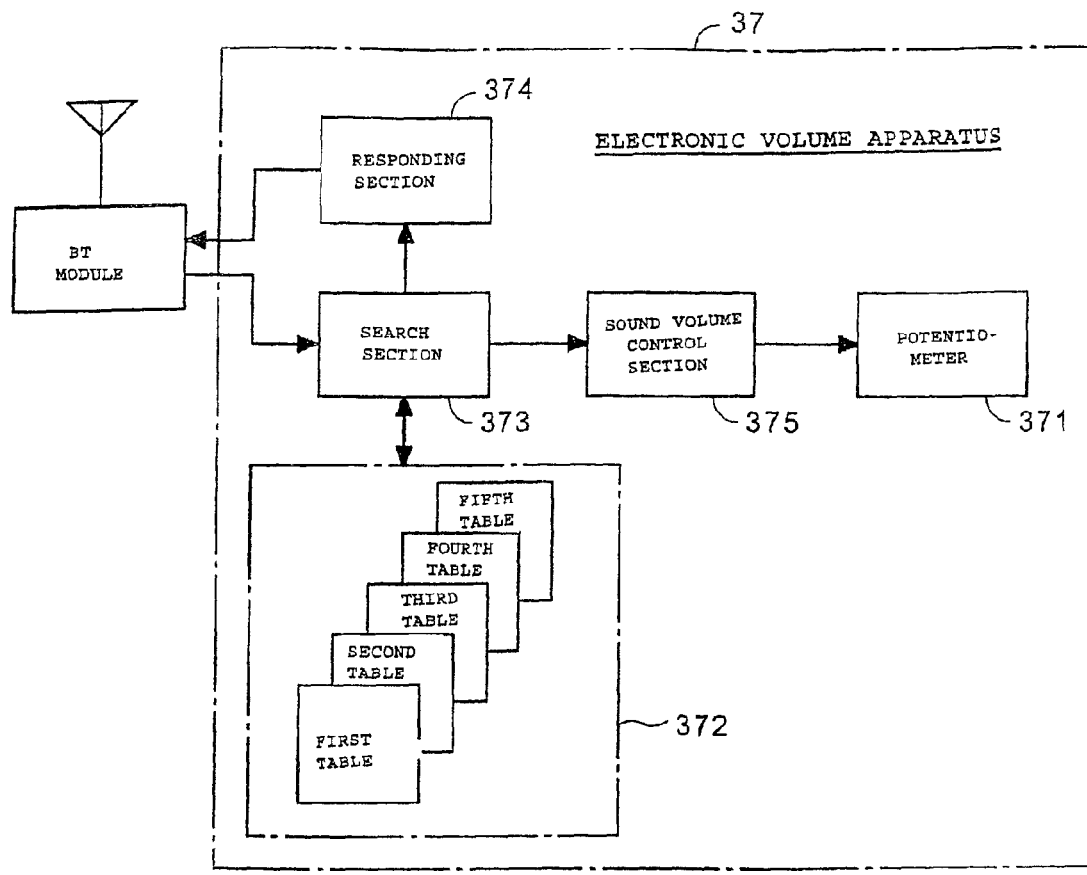
FIG. 4 is a functional block diagram showing a configuration of principal part of an electronic volume apparatus.

FIG. 4 is a functional block diagram showing a configuration of principal part of the electronic volume apparatus 37 of the audio terminal 13. The digital potentiometer 371 sets the amplification factor (Gamp) of the potentiometer 371 in response to a requested sound volume value (Vreq) transmitted from the remote controller 14 and sends back an actual result sound volume value (Vrep) in response to the requested sound volume value (Vreq).

A coordination relationship among requested sound volume values (Vreq), actual result sound volume values (Vrep) and amplification factors (Gamp) is defined in a coordination relationship storage section 372 such that some of the requested sound volume values are coordinated uniquely with the amplification factors (Gamp) and the actual result sound volume values (Vrep) as hereinafter described in detail. A search section 373 searches an amplification factor (Gamp) and an actual result sound volume value (Vrep) coordinated with a requested sound volume value (Vreq) received from the remote controller 14 from within the coordination relationship storage section 372. A sound volume control section 375 controls the potentiometer 371 based on a result of the search of the amplification factor (Gamp). A responding section 374 sends back the actual result sound volume value (Vrep) to the remote controller 14.

FIG. 5 is a view illustrating a coordination relationship among requested sound volume values (Vreq) to be transmitted from the remote controller 14. Four different sound volume levels (L) (1# to 4#) can be designated by switch operation of keys 39a, 39b of the audio terminal 13 and amplification factors (Gamp) of the digital potentiometer 371 in the present embodiment.

In the present embodiment, using keys 39a, 39b of the audio terminal 13, the four sound volume levels (L) (1# to 4#) of the audio terminal 13 are restricted to the four steps (1# to 4#) of "very small sound volume level suitable during stopping", "small sound volume level suitable for traveling at a low vehicle speed", "medium sound volume level suitable for traveling at a medium vehicle speed" and "maximum sound volume level suitable for traveling at a high vehicle speed", respectively. Further, the amplification factors (Gamp) "19#", "23#", "27#" and "30#" are coordinated uniquely with them. Furthermore, the requested sound volume values (Vreq) "1#", "5#", "10#" and "15#" are coordinated uniquely with them.

In particular, in the present embodiment, if "10#" is transmitted as the requested sound volume value Vreq from the remote controller 14, or if "3#" is designated as a sound volume level L by switch operation of keys 39a, 39b of the audio terminal 13, then the amplification factor Gamp of the digital potentiometer 371 is set to 27#.

FIG. 6 is a view illustrating an example of a coordination relationship between the requested sound volume values Vreq, amplification factors Gamp and actual result sound volume values Vrep set based on the coordination relationship illustrated in FIG. 5 and registered in the coordination relationship storage section 372 of FIG. 4. In the present embodiment, the coordination relationship is dispersed into five data tables.

The first table is made a search object where the requested sound volume value Vreq received from the remote controller 14 is equal to or lower than "5#". The second and fourth tables are made a search object where the requested sound volume value Vreq ranges from "6#" to "10#". The third and fifth tables are made a search object where the requested sound volume value Vreq is equal to or higher than "11#".

Figure 7:
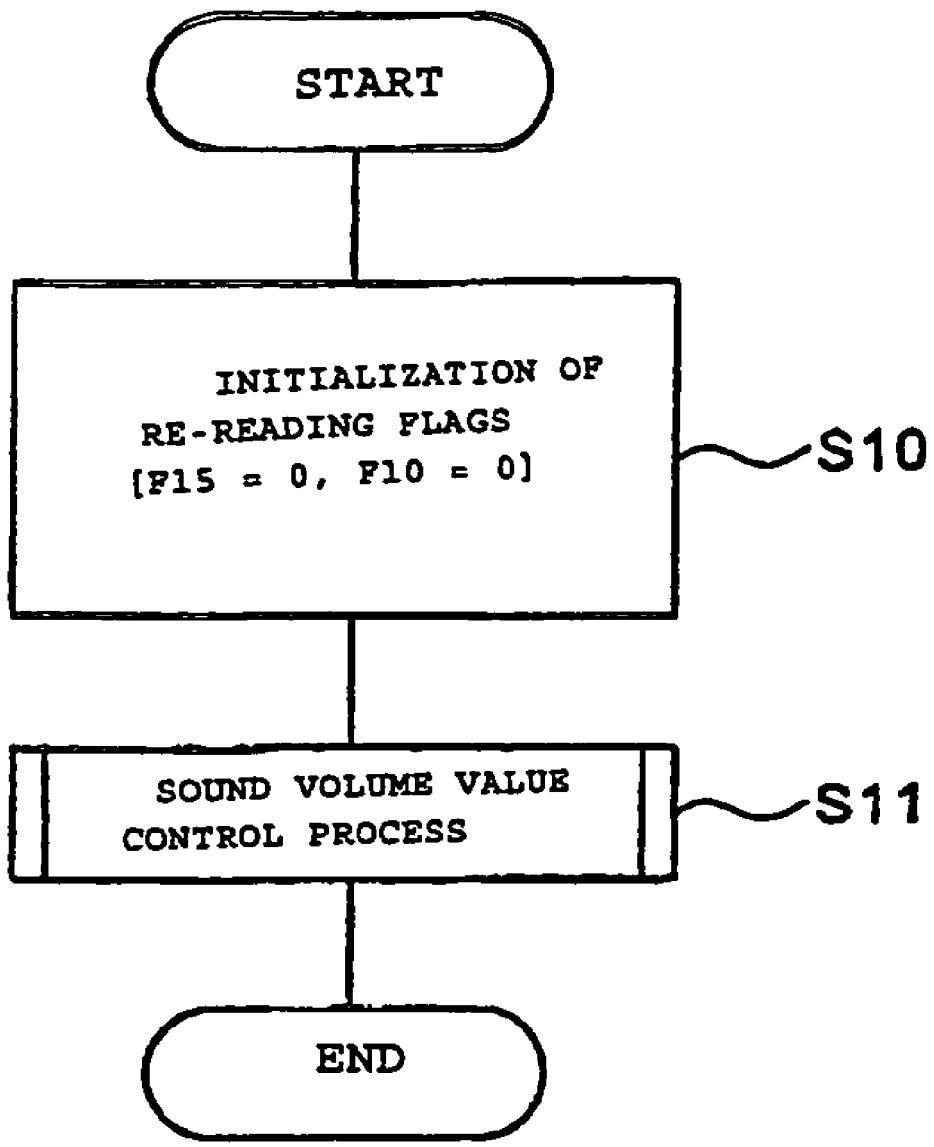
FIG. 7 is a flow chart (part 1) illustrating operation of the present embodiment.

Now, the operation of the present embodiment is described with reference to flow charts of FIGS. 7 and 8. Referring to FIG. 7, at step S10, two re-reading flags F10 and F15 hereinafter described are initialized so as to be reset to "0". The re-reading flag F10 is used to distinguish which one of the second and fourth tables should be made as an object of search when the requested sound volume value Vreq received from the remote controller 14 is one of "6#" to "10#". The re-reading flag F15 is used to distinguish which one of the third and fifth tables should be made as an object of search when the requested sound volume value Vreq received from the remote controller 14 is equal to or higher than "11#". At step S11, sound volume value control for controlling the amplification factor of the potentiometer based on the requested sound volume value Vreq received from the remote controller 14 is executed.

Figure 8:
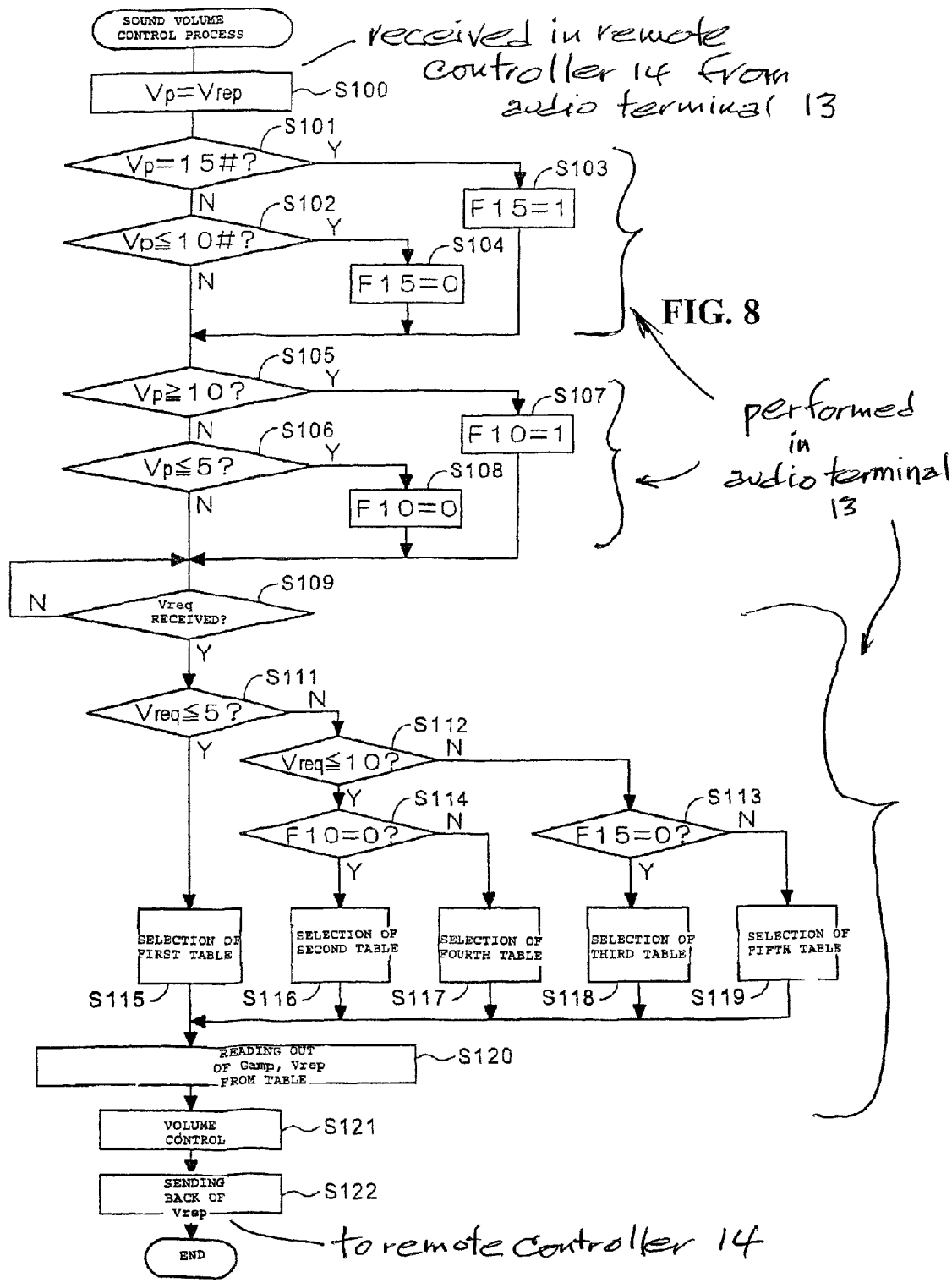
FIG. 8 is a flow chart (part 2) illustrating operation of the present embodiment.

FIG. 8 is a flow chart illustrating a procedure of the sound volume control, and at step S100, an actual result sound volume value Vrep sent back last to the remote controller 14 is set to a sound volume value pointer Vp. At steps S101 and S102, the current value of the sound volume value pointer Vp is referred to, and if Vp=15#, then the processing advances to step S103, at which the re-reading flag F15 is set (=1). If the current value of the sound volume value pointer Vp is Vp≦10#, then the processing advances to step S104, at which the re-reading flag F15 is reset (=0). If the current value of the sound volume value pointer Vp is 10#<Vp<15#, then the processing advances to step S105 without updating the re-reading flag F15.

At steps S105 and S106, the sound volume value pointer Vp is referred to again, and if Vp≧10#, then the processing advances to step S107, at which the re-reading flag F10 is set. If Vp≦5#, then the processing advances to step S108, at which the re-reading flag F10 is reset. If 5#<Vp<10#, then the processing advances to step S109 without updating the re-reading flag F10. FIG. 9 is a view illustrating a relationship between the sound volume value pointer Vp and the re-reading flags F10 and F15 described above in the form of a table.

If a requested sound volume value Vreq is transmitted from the remote controller 14 and received at step S109, then at steps S111 and S112, the requested sound volume value Vreq is referred to, and if Vreq≦5#, then the processing advances to step S115, at which the first table is selected as a search object table. If 5#<Vreq≦10#, then the processing advances to step S114, but if 10#<Vreq, then the processing advances to step S113.

At step S114, the re-reading flag F10 is referred to, and if the re-reading flag F10 is in a reset state, then the processing advances to step S116, at which the second table is selected, but if the re-reading flag F10 is in a set state, then the processing advances to step S117, at which the fourth table is selected. At step S113, the re-reading flag F15 is referred to, and if the re-reading flag F15 is in a reset state, then the processing advances to step S118, at which the third table is selected, but if the re-reading flag F15 is in a set state, then the processing advances to step S119, at which the fifth table is selected.

At step S120, a proper sound volume level L and an amplification factor Gamp coordinated with the requested sound volume value Vreq are read out from the selected table. At step S121, the digital potentiometer 371 is controlled based on the read out amplification factor Gamp. At step S122, the read out actual result sound volume value Vrep is sent back to the remote controller 14.

Now, a procedure of adjusting the sound volume level L when the sound volume adjustment key 49a, 49b is operated on the remote controller 14 is described with reference sequence diagrams of FIGS. 10 to 13. Here, a description is started from a state wherein the current values of the sound volume value pointer Vp of the remote controller 14 and the audio terminal 13 are both "5#" and the re-reading flags F15 and F10 of the audio terminal 13 are both in a reset state (=0).

Figure 10:
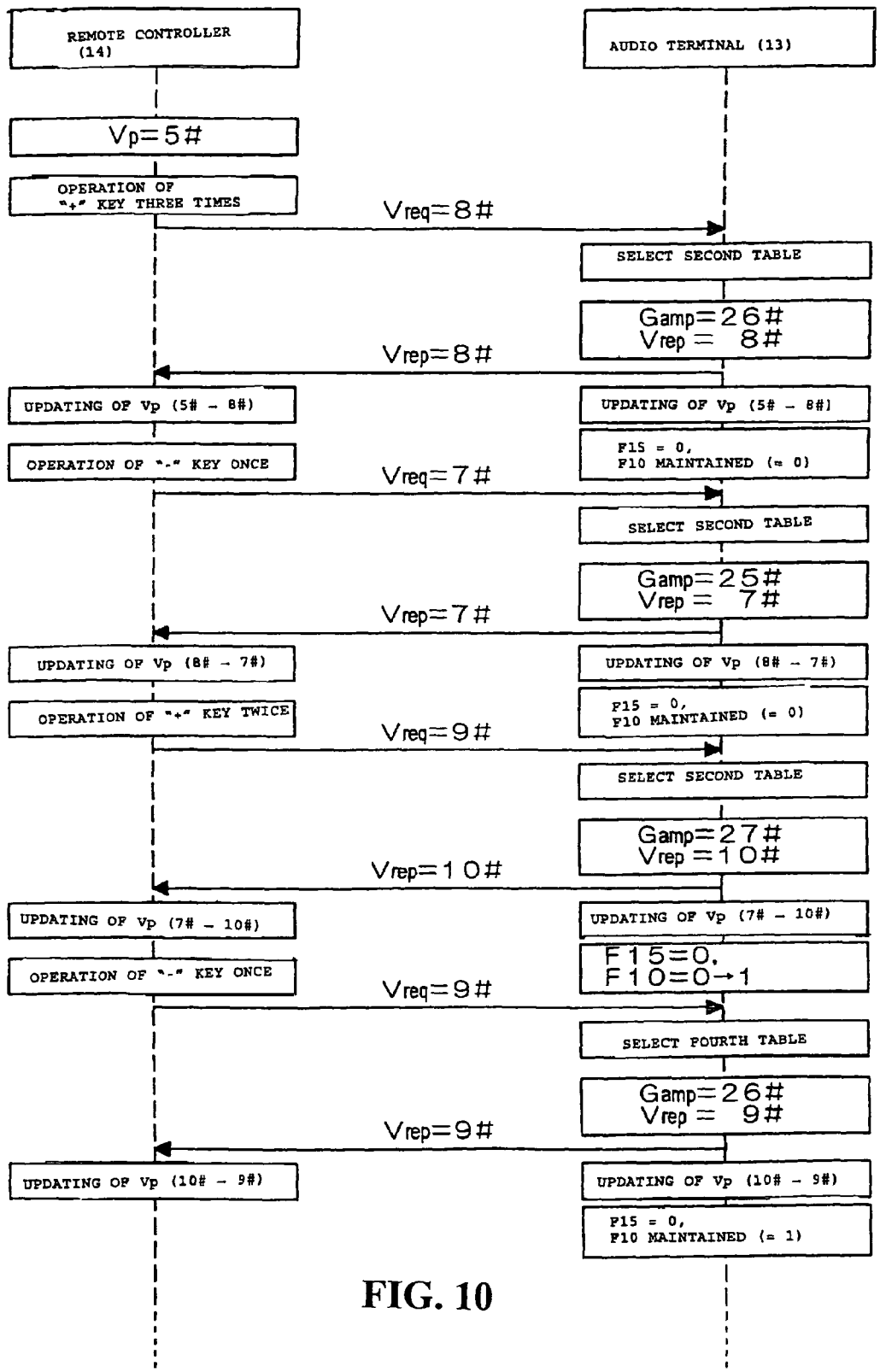
FIG. 10 is a sequence diagram (part 1) illustrating a procedure of adjustment of the sound volume value when a sound volume adjustment key of the remote controller is operated.

As seen in FIG. 10, when the sound volume adjustment "+" key 49a is depressed three times on the remote controller 14, then "8#" higher by three steps than the current value "5#" of the sound volume value pointer Vp is transmitted as a requested sound volume value Vreq from the remote controller 14. In the audio terminal 13, when the requested sound volume value Vreq of "#8" is received at step S109, the processing advances to step S114 through steps S111 and S112. At step S114, it is decided that the re-reading flag F10 is in a reset state. Consequently, the processing advances to step S116, at which the second table is selected.

At step S120, "26#" and "8#" are read out as the amplification factor Gamp and the actual result sound volume value Vrep coordinated with the requested sound volume value Vreq "8#" in the present cycle from the second table. At step S121, the digital potentiometer 371 is controlled based on the read out amplification factor "26#". At step S122, the read out actual result sound volume value Vrep "8#" is sent back to the remote controller 14.

In the next cycle, the sound volume value pointer Vp is updated from "5#" to "8#" at step S100. At steps S101 to S108, the re-reading flag F15 is reset (=0) while the re-reading flag F10 maintains the current value (=0). On the other hand, also in the remote controller 14 which receives the actual result sound volume value Vrep "8#", the sound volume value pointer Vp is updated from "5#" to "8#".

If the sound volume adjustment "−"key 49b is depressed further once on the remote controller 14, then "7#" higher by one step than the current value "8#" of the sound volume value pointer Vp is transmitted as the requested sound volume value Vreq from the remote controller 14. In response to the reception of the requested sound volume value Vreq "7#", the audio terminal 13 advances its processing through steps S111, S112 and S114 to step S116, at which the second table is selected. At step S120, "25#" and "7#" are read out as an amplification factor Gamp and an actual result sound volume value Vrep coordinated with the requested sound volume value Vreq "7#" in the present cycle from the second table. At step S121, the digital potentiometer 371 is controlled based on the read out amplification factor Gamp "25#". At step S122, the read out actual result sound volume value Vrep "7#" is sent back to the remote controller 14. In the next cycle, the sound volume value pointer Vp is updated from "8#" to "7#" at step S100. At steps S101 to S108, the re-reading flag F15 is reset while the re-reading flag F10 maintains it current value (=0). On the other hand, also in the remote controller 14 which receives the actual result sound volume value Vrep "7#", the sound volume value pointer Vp is updated from "8#" to "7#".

If the sound volume adjustment "+"key 49*b* is depressed twice on the remote controller 14, then "9#" higher by 2 steps than the current value "7#" of the sound volume value pointer Vp is transmitted as the requested sound volume value Vreq from the remote controller 14. In response to the reception of the requested sound volume value Vreq "9#", the audio terminal 13 advances its processing through steps S111, S112 and S114 to step S116, at which the second table is selected.

At step S120, "27#" and "10#" are read out as an amplification factor Gamp and an actual result sound volume value Vrep coordinated with the requested sound volume value Vreq "9#" in the present cycle from the second table. At step S121, the digital potentiometer 371 is controlled based on the read out amplification factor Gamp "27#". At step S122, the read out actual result sound volume value Vrep "10#" is sent back to the remote controller 14.

In the next cycle, the sound volume value pointer Vp is updated from "7#" to "10#" at step S100. At steps S101 to S108, the re-reading flag F15 is reset while the re-reading flag F10 is set. On the other hand, also in the remote controller 14 which receives the actual result sound volume value Vrep "10#", the sound volume value pointer Vp is updated from "7#" to "10#".

If the sound volume adjustment "−"key 49*b* is depressed further once on the remote controller 14, then "9#" lower by one step than the current value "10#" of the sound volume value pointer Vp is transmitted as the requested sound volume value Vreq from the remote controller 14. In response to the reception of the requested sound volume value Vreq "9#", the audio terminal 13 advances its processing through steps S111 and S112 to S114, at which it is decided that the re-reading flag F10 is in a set state. Therefore, the processing advances to step S117, at which the fourth table is selected.

At step S120, "26#" and "9#" are read out as an amplification factor Gamp and an actual result sound volume value Vrep coordinated with the requested sound volume value Vreq "9#" in the present cycle from the fourth table. At step S121, the digital potentiometer 371 is controlled based on the read out amplification factor Gamp "26#". At step S122, the read out actual result sound volume value Vrep "9#" is sent back to the remote controller 14.

In the next cycle, the sound volume value pointer Vp is updated from "10#" to "9#" at step S100. At steps S101 to S108, the re-reading flag F15 is reset while the re-reading flag F10 maintains its current value (=1). On the other hand, also in the remote controller 14 which receives the actual result sound volume value Vrep "9#", the sound volume value pointer Vp is updated from "10#" to "9#".

Figure 11:
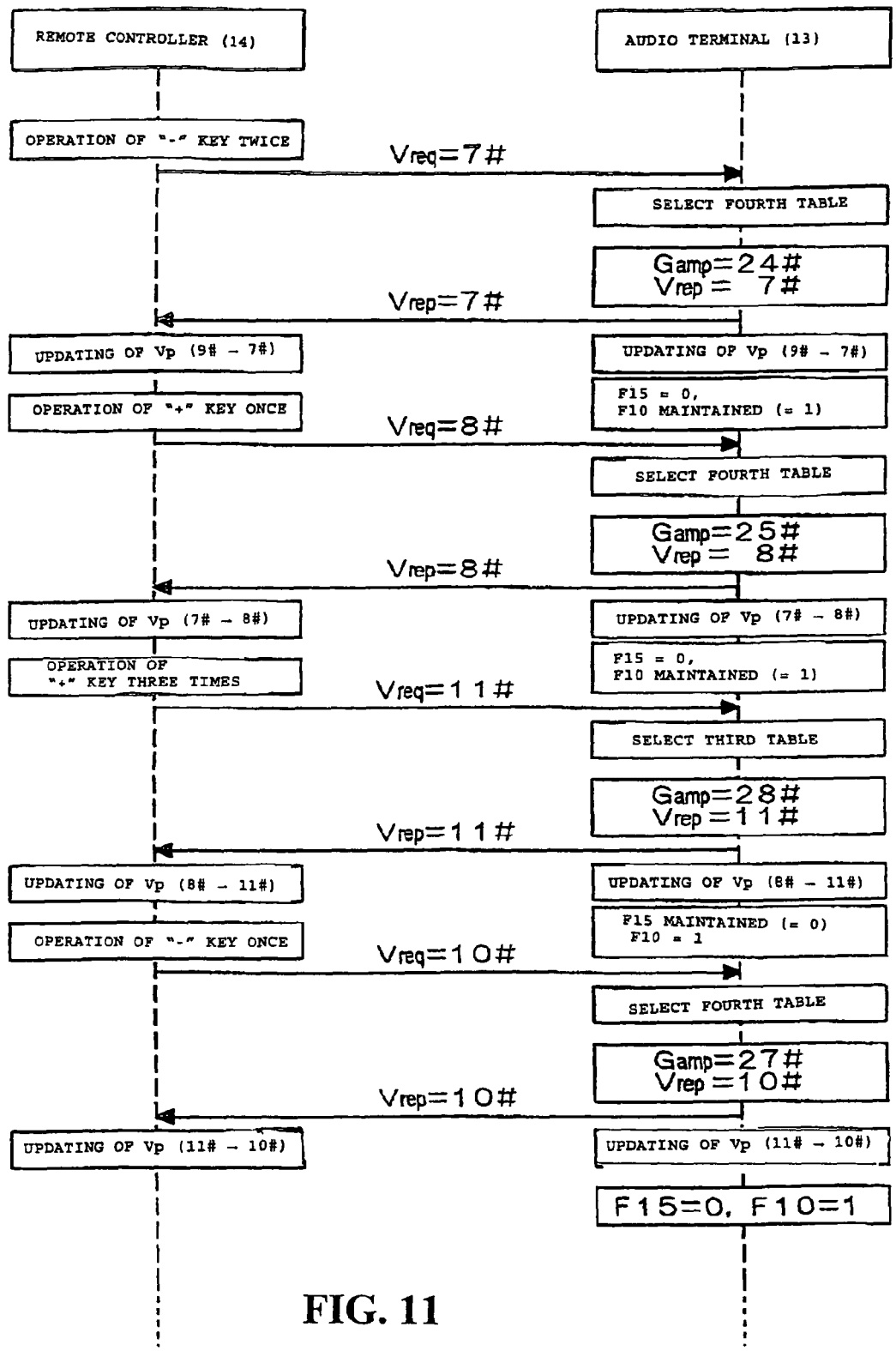
FIG. 11 is a sequence diagram (part 2) illustrating the procedure of adjustment of the sound volume value when the sound volume adjustment key of the remote controller is operated.

Referring now to FIG. 11, if the sound volume adjustment "−"key 49*b* is depressed further twice on the remote controller 14, then "7#" lower by two steps than the current value "9#" of the sound volume value pointer Vp is transmitted as the requested sound volume value Vreq from the remote controller 14. In response to the reception of the requested sound volume value Vreq "7#", the audio terminal 13 advances its processing through steps S111, S112 and S114 to step S117, at which the fourth table is selected. At step S120, "24#" and "7#" are read out as an amplification factor Gamp and an actual result sound volume value Vrep coordinated with the requested sound volume value Vreq "7#" in the present cycle from the fourth table. At step S121, the digital potentiometer 371 is controlled based on the read out amplification factor Gamp "24#". At step S122, the read out actual result sound volume value Vrep "7#" is sent back to the remote controller.

In the next cycle, the sound volume value pointer Vp is updated from "9#" to "7#" at step S100. At steps S101 to S108, the re-reading flag F15 is reset while the re-reading flag F10 maintains its current value (=1). On the other hand, also in the remote controller 14 which receives the actual result sound volume value Vrep "7#", the sound volume value pointer Vp is updated from "9#" to "7#".

If the sound volume adjustment "+" key 49*a* is depressed further once on the remote controller 14, then "8#" higher by one step than the current value "7#" of the sound volume value pointer Vp is transmitted as the requested sound volume value Vreq from the remote controller 14. In response to the reception of the requested sound volume value Vreq "8#", the audio terminal 13 advances its processing through steps S111, S112 and S114 to step S117, at which the fourth table is selected. At step S120, "25#" and "8#" are read out as an amplification factor Gamp and an actual result sound volume value Vrep coordinated with the requested sound volume value Vreq "8#" in the present cycle from the fourth table, respectively. At step S121, the digital potentiometer 371 is controlled based on the read out amplification factor Gamp "25#". At step S122, the read out actual result sound volume value Vrep "8#" is sent back to the remote controller 14.

In the next cycle, the sound volume value pointer Vp is updated from "7#" to "8#" at step S100. At steps S101 to S108, the re-reading flag F15 is reset while the re-reading flag F10 maintains its current value (=0). On the other hand, also in the remote controller 14 which receives the actual result sound volume value Vrep "8#", the sound volume value pointer Vp is updated from "7#" to "8#".

If the sound volume adjustment "+"key 49*a* is depressed further three times on the remote controller 14, then "11#" higher by three steps than the current value "8#" of the sound volume value pointer Vp is transmitted as the requested sound volume value Vreq from the remote controller 14. In response to the reception of the requested sound volume value Vreq "11#", the audio terminal 13 advances its processing through steps S111 and S112 to step S113. At step S113, it is decided that the re-reading flag F15 is in a reset state. Consequently, the processing advances to step S118, at which the third table is selected. At step S120, "28#" and "11 #" are read out as an amplification factor Gamp and an actual result sound volume value Vrep coordinated with the requested sound volume value Vreq "11#" in the present cycle from the third table. At step S121, the digital potentiometer 371 is controlled based on the read out amplification factor Gamp "25#". At step S122, the read out actual result sound volume value Vrep "11#" is sent back to the remote controller 14.

In the next cycle, the sound volume value pointer Vp is updated from "8#" to "11#" at step S100. At steps S101 to S108, the re-reading flag F15 maintains the current value (=0) while the re-reading flag F10 is set. On the other hand, also in the remote controller 14 which receives the actual result sound volume value Vrep "11#", the sound volume value pointer Vp is updated from "8#" to "11#".

If the sound volume adjustment "−"key 49*b* is depressed further once on the remote controller 14, then "10#" lower by one step than the current value "11#" of the sound volume value pointer Vp is transmitted as the requested sound volume value Vreq from the remote controller 14. In response to the reception of the requested sound volume value Vreq "10#", the audio terminal 13 advances its processing through steps S111 and S112 to S114. At step S114, it is decided that the re-reading flag F10 is in a reset state. Consequently, the processing advances to step S117, at which the fourth table is selected. At step S120, "27#" and "10#" are read out as an amplification factor Gamp and an actual result sound volume value Vrep coordinated with the requested sound volume value Vreq "10#" in the present cycle from the fourth table. At step S121, the digital potentiometer 371 is controlled based on the read out amplification factor Gamp "27#". At step S122, the read out actual result sound volume value Vrep "10#" is sent back to the remote controller 14.

In the next cycle, the sound volume value pointer Vp is updated from "11#" to "10#" at step S100. At steps S101 to S108, the re-reading flag F15 is reset while the re-reading flag F10 is set. On the other hand, also in the remote controller which receives the actual result sound volume value Vrep "10#", the sound volume value pointer Vp is updated from "11#" to "10#".

Figure 12:
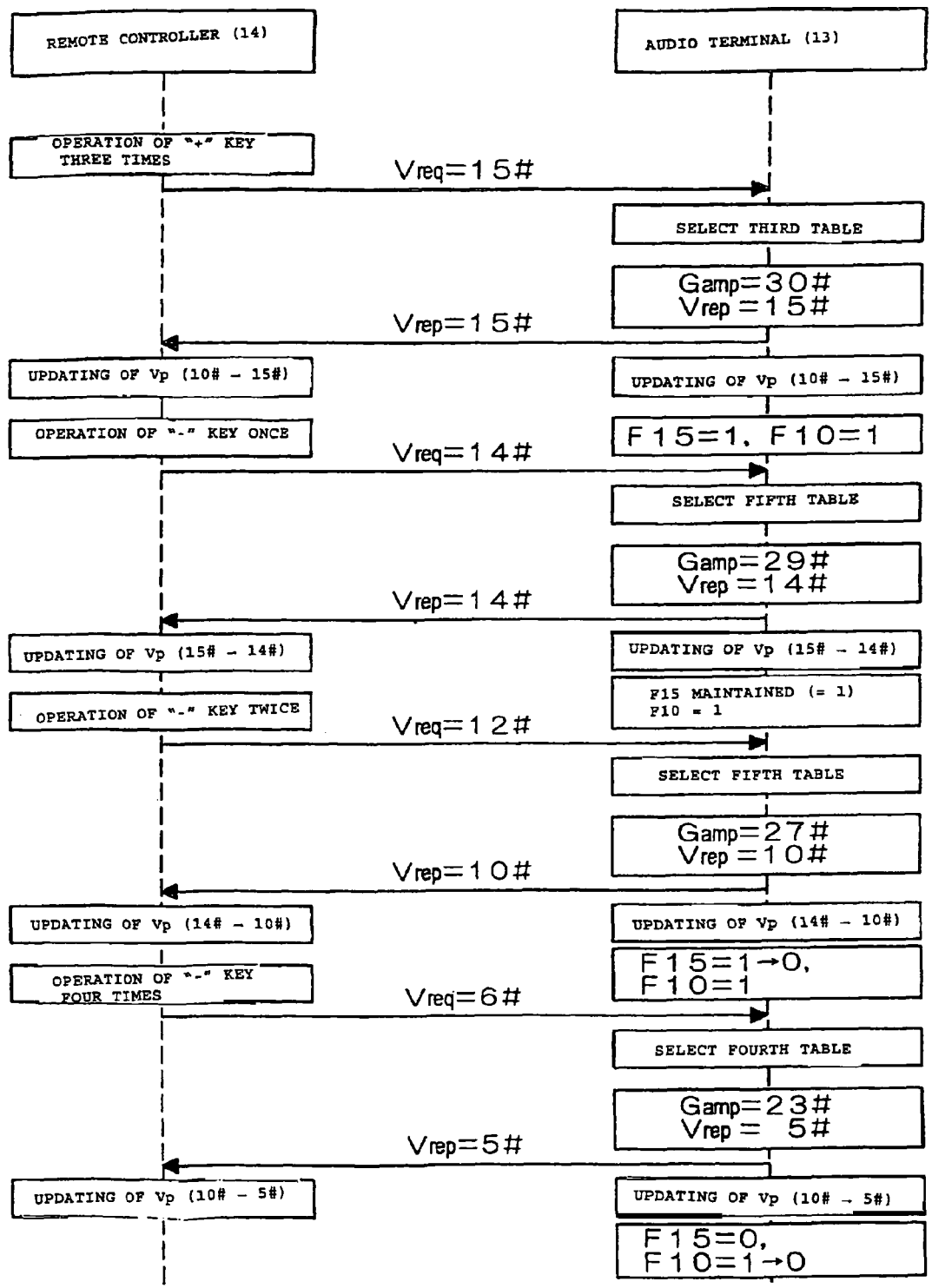
FIG. 12 is a sequence diagram (part 3) illustrating the procedure of adjustment of the sound volume value when the sound volume adjustment key of the remote controller is operated.

Referring now to FIG. 12, if the sound volume adjustment "+"key 49a is depressed further three times on the remote controller 14, then "13#" higher by three steps than the current value "10#" of the sound volume value pointer Vp is transmitted as the requested sound volume value Vreq from the remote controller 14. In response to the reception of the requested sound volume value Vreq "13#", the audio terminal 13 advances its processing through steps S111 and S112 to step S113. At step S113, it is decided that the re-reading flag F15 is in a reset state. Consequently, the processing advances to step S118, at which the third table is selected. At step S120, "30#" and "15#" are read out as an amplification factor Gamp and an actual result sound volume value Vrep coordinated with the requested sound volume value Vreq "13#" in the present cycle from the third table. At step S121, the digital potentiometer 371 is controlled based on the read out Gamp "30#". At step S122, the read out actual result sound volume value Vrep "15#" is sent back to the remote controller 14.

In the next cycle, the sound volume value pointer Vp is updated from "10#" to "15#" at step S100. At steps S101 to S108, both of the re-reading flags F15 and F10 are set. On the other hand, also in the remote controller 14 which receives the actual result sound volume value Vrep "15#", the sound volume value pointer Vp is updated from "10#" to "15#".

If the sound volume adjustment "−"key 49b is depressed further once on the remote controller 14, then "14#" lower by one step than the current value "15#" of the sound volume value pointer Vp is transmitted as the requested sound volume value Vreq from the remote controller 14. In response to the reception of the requested sound volume value Vreq "14#", the audio terminal 13 advances its processing through steps S111 and S112 to S113. At step S113, it is decided that the re-reading flag F15 is in a set state. Consequently, the processing advances to step S119, at which the fifth table is selected. At step S120, "29#" and "14#" are read out as an amplification factor Gamp and an actual result sound volume value Vrep coordinated with the requested sound volume value Vreq "14#" in the present cycle from the fifth table. At step S121, the digital potentiometer 371 is controlled based on the read out amplification factor Gamp "29#". At step S122, the read out actual result sound volume value Vrep "14#" is sent back to the remote controller 14.

In the next cycle, the sound volume value pointer Vp is updated from "15#" to "14#" at step S100. At steps S101 to S108, the re-reading flag F15 maintains the current value (=1) while the re-reading flag F10 is set. On the other hand, also in the remote controller which receives the actual result sound volume value Vrep "14#", the sound volume value pointer Vp is updated from "15#" to "14#".

If the sound volume adjustment "−"key 49b is depressed further twice on the remote controller 14, then "12#" lower by two steps than the current value "14#" of the sound volume value pointer Vp is transmitted as the requested sound volume value Vreq from the remote controller 14. In response to the reception of the requested sound volume value Vreq "12#", the audio terminal 13 advances its processing through steps S111, S112 and S113 to S119, at which the fifth table is selected. At step S120, "27#" and "10#" are read out as an amplification factor Gamp and an actual result sound volume value Vrep coordinated with the requested sound volume value Vreq "12#" in the present cycle from the fifth table. At step S121, the digital potentiometer 371 is controlled based on the read out amplification factor Gamp "27#". At step S122, the read out actual result sound volume value Vrep "10#" is sent back to the remote controller 14.

In the next cycle, the sound volume value pointer Vp is updated from "14#" to "10#" at step S100. At steps S101 to S108, the re-reading flag F15 is reset while the re-reading flag F10 is set. On the other hand, also in the remote controller which receives the actual result sound volume value Vrep "14#", the sound volume value pointer Vp is updated from "14#" to "10#".

If the sound volume adjustment "−"key 49b is depressed further four times on the remote controller 14, then "6#" is lower by four steps relative to the current value "10#" of the sound volume value pointer Vp and is transmitted as the requested sound volume value Vreq from the remote controller 14. In response to the reception of the requested sound volume value Vreq "6#", the audio terminal 13 advances its processing through steps S111 and S112 to S114. At step S114, it is decided that the re-reading flag F10 is in a set state. Consequently, the processing advances to step S117, at which the fourth table is selected. At step S120, "23#" and "5#" are read out as the coordination relationship storage section 372 coordinated with the requested sound volume value Vreq "6#" in the present cycle. At step S121, the digital potentiometer 371 is Controlled based on the read out amplification factor Gamp "23#". At step S122, the read out actual result sound volume value Vrep "5#" is sent back to the remote controller 14.

In the next cycle, the sound volume value pointer Vp is updated from "10#" to "5#" at step S100. At steps S101 to S108, both of the re-reading flags F15 and F10 are reset. On the other hand, also in the remote controller which receives the actual result sound volume value Vrep "5#", the sound volume value pointer Vp is updated from "10#" to "5#".

Figure 13:
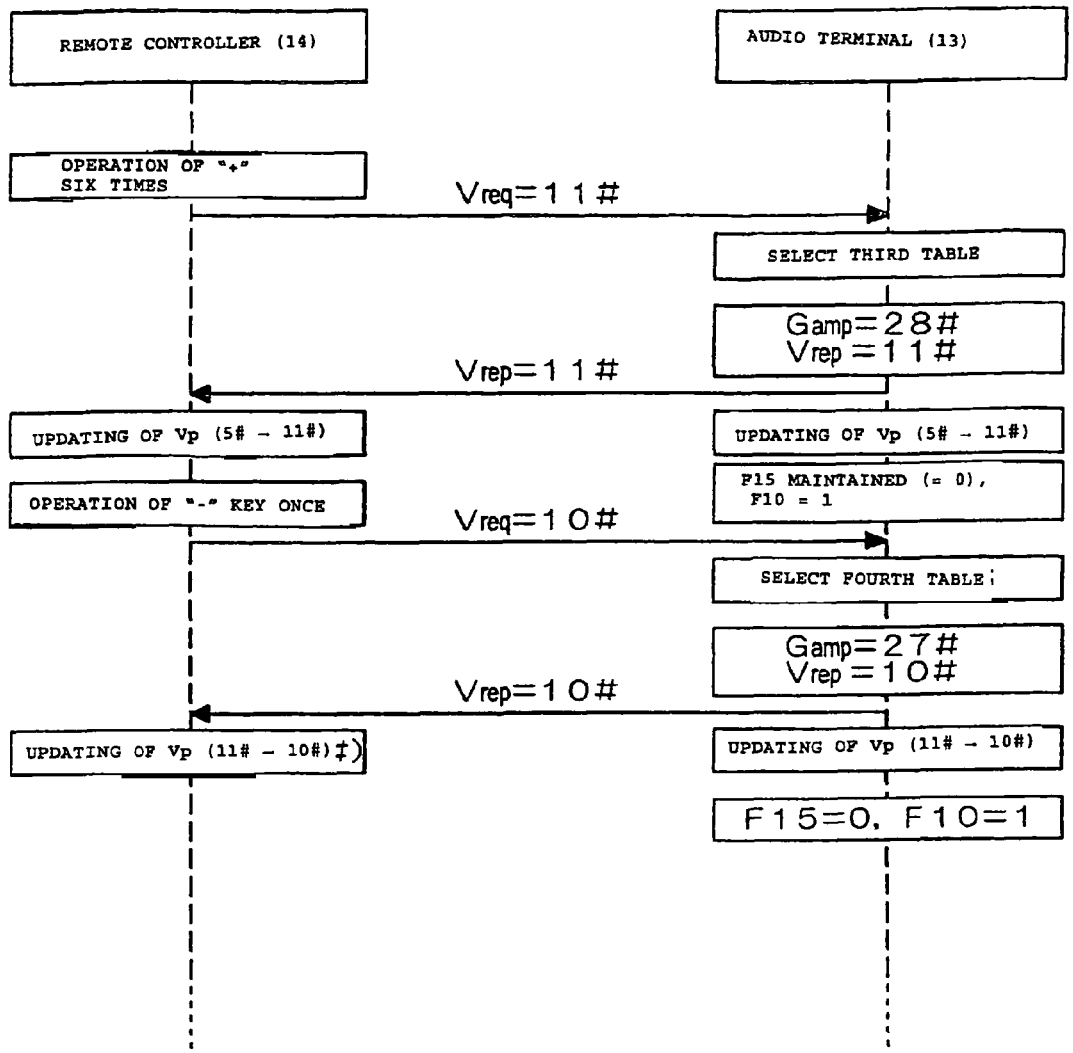
FIG. 13 is a sequence diagram (part 4) illustrating the procedure of adjustment of the sound volume value when the sound volume adjustment key of the remote controller is operated.

Referring now to FIG. 13, if the sound volume adjustment "+"key 49a is depressed a further six times on the remote controller 14, then "11#" higher by six steps than the current value "5#" of the sound volume value pointer Vp is transmitted as the requested sound volume value Vreq from the remote controller 14. In response to the reception of the requested sound volume value Vreq "11#", the audio terminal 13 advances its processing through steps S111 and S112 to S113. At step S113, it is decided that the re-reading flag F15 is in a reset state. Consequently, the processing advances to step S118, at which the third table is selected. At step S120, "28#" and "11#" are read out as an amplification factor Gamp and an actual result sound volume value Vrep coordinated with the requested sound volume value Vreq "11#" in the present cycle from the third table. At step S121, the digital potentiometer 371 is controlled based on the read out amplification factor Gamp "28#". At step S122, the read out actual result sound volume value Vrep "11#" is sent back to the remote controller 14.

In the next cycle, the sound volume value pointer Vp is updated from "5#" to "11#" at step S100. At steps S101 to S108, the re-reading flag F15 maintains the current value (=0) while the re-reading flag F10 is set. On the other hand, also in the remote controller 14 which receives the actual result sound volume value Vrep "11#", the sound volume value pointer Vp is updated from "5#" to "11#".

If the sound volume adjustment "–"key 49b is depressed further once on the remote controller 14, then "10#" is lower by one step relative to the current value "11#" of the sound volume value pointer Vp is transmitted as the requested sound volume value Vreq from the remote controller 14. In response to the reception of the requested sound volume value Vreq "10#", the audio terminal 13 advances its processing through steps S111 and S112 to S114. At step S114, it is decided that the re-reading flag F10 is in a set state. Consequently, the processing advances to step S117, at which the fourth table is selected. At step S120, "27#" and "10#" are read out as an amplification factor Gamp and an actual result sound volume value Vrep coordinated with the requested sound volume value Vreq "10#" in the present cycle from the fourth table. At step S121, the digital potentiometer 371 is controlled based on the read out amplification factor Gamp "27#". At step S122, the read out actual result sound volume value Vrep "10#" is sent back to the remote controller 14.

In the next cycle, the sound volume value pointer Vp is updated from "11#" to "10#" at step S100. At steps S101 to S108, the re-reading flag F15 is reset while the re-reading flag F10 is set. On the other hand, also in the remote controller which receives the actual result sound volume value Vrep "10#", the sound volume value pointer Vp is updated from "11#" to "10#".

According to the present embodiment, even if the number of steps of sound volume adjustment of the remote controller and the number of steps of sound volume adjustment of the potentiometer are different from each other, sound volume control which is high in fidelity to sound volume operation can be performed. Consequently, the sound volume adjustment operation which does not provide an unfamiliar feeling can be anticipated. Further, in the present embodiment, since a coordination relationship among the requested sound volume values, actual result sound volume values and amplification factors is defined in the data tables, the load of a process for determining an actual result sound volume value and an amplification factor coordinated with a requested sound volume adjustment received from the remote controller can be reduced.

Figure 15:
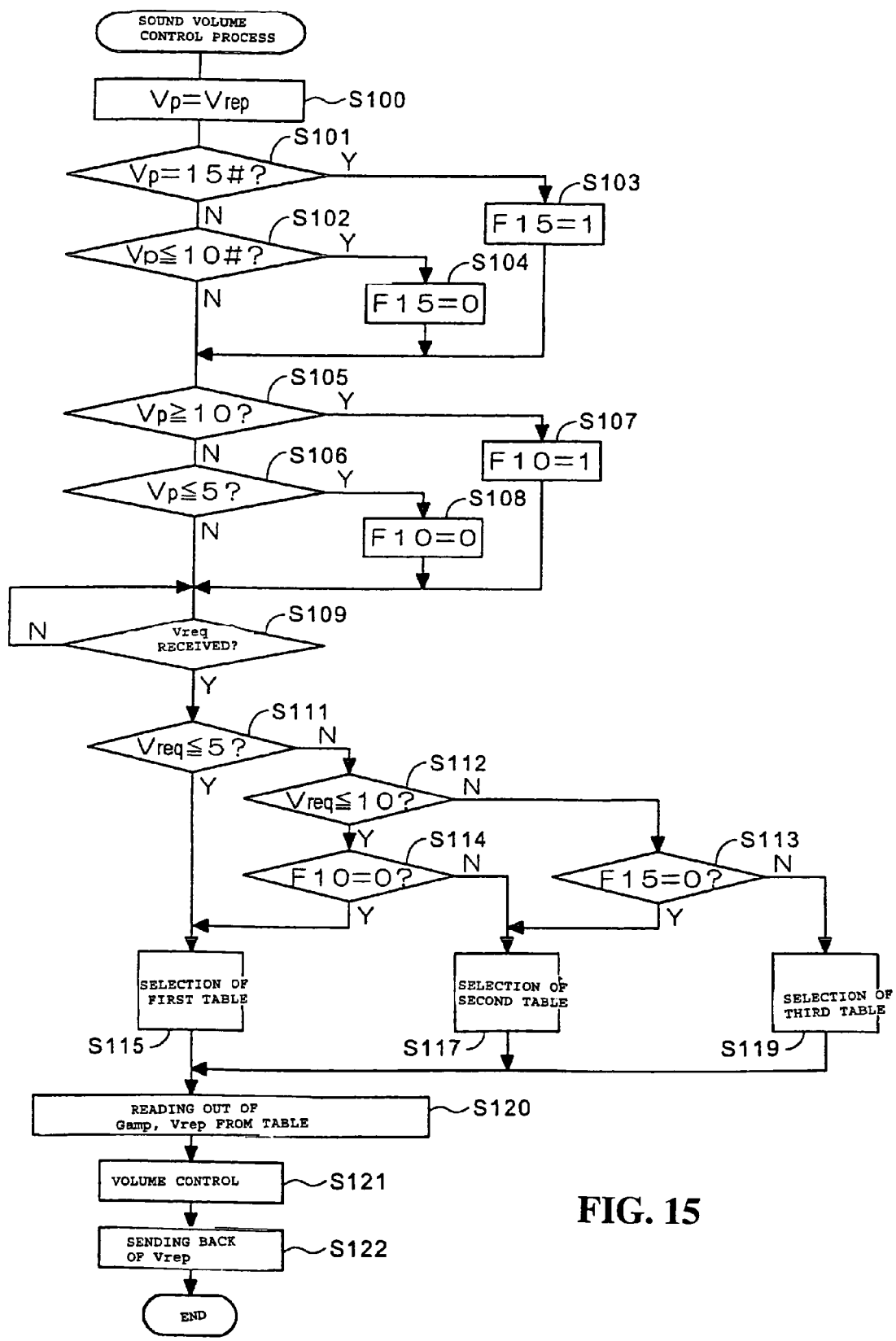
FIG. 15 is a flow chart illustrating operation of the second embodiment.

It is to be noted that, while it is described in the embodiment described above that the coordination relationship storage section 372 includes five data tables provided dispersedly. In the alternative, it may include three data tables provided dispersedly as in a second embodiment whose example is shown in FIG. 14. In this instance, however, it is necessary to modify the procedure of the sound volume value control as illustrated in FIG. 15.

Further, while it is described in the embodiments described above that the data tables are utilized to define a coordination relationship among the requested sound volume values Vreq, amplification factors Gamp and actual result sound volume values Vrep, the present invention is not limited only to this, but the coordination relationship may otherwise be defined based on an arithmetic operation of a function as in a third embodiment described below.

Figure 16:
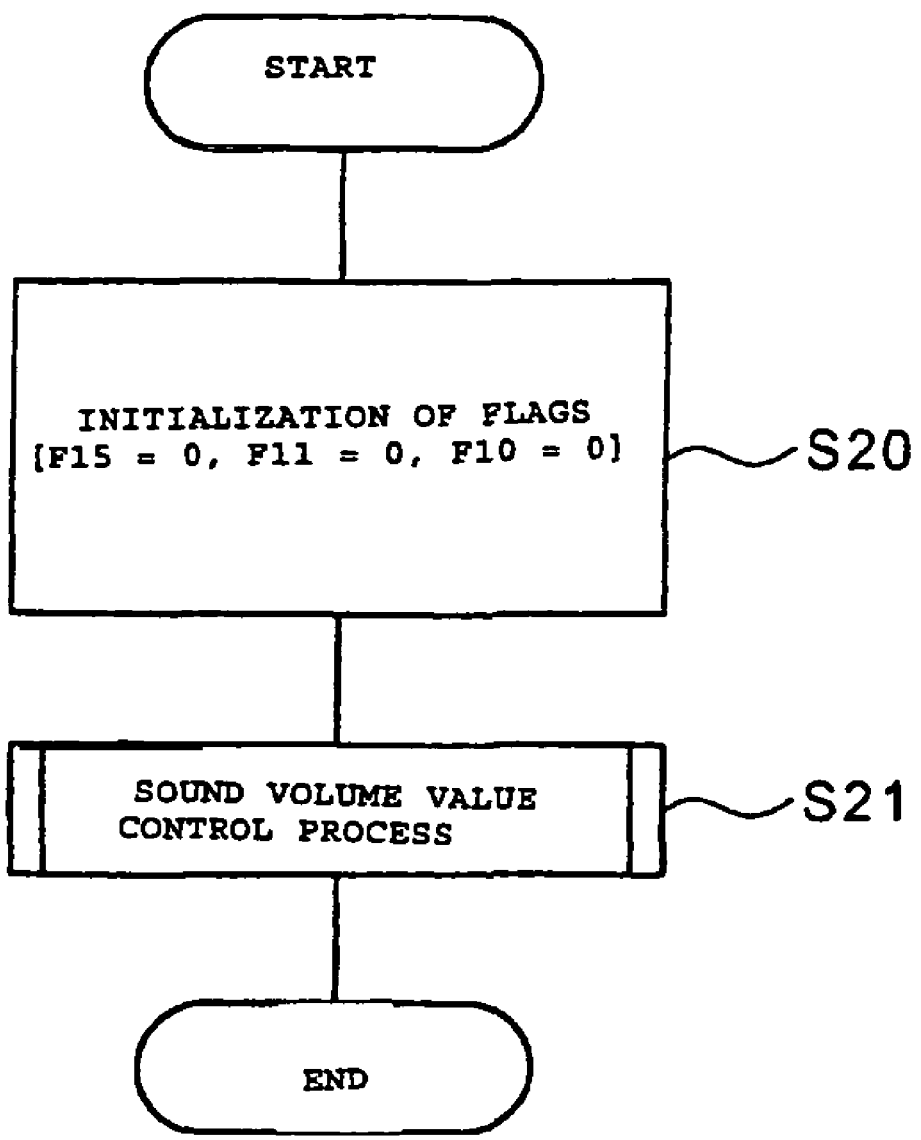
FIG. 16 is a flow chart (part 1) illustrating the operation of a third embodiment of the present invention.
Figure 17:
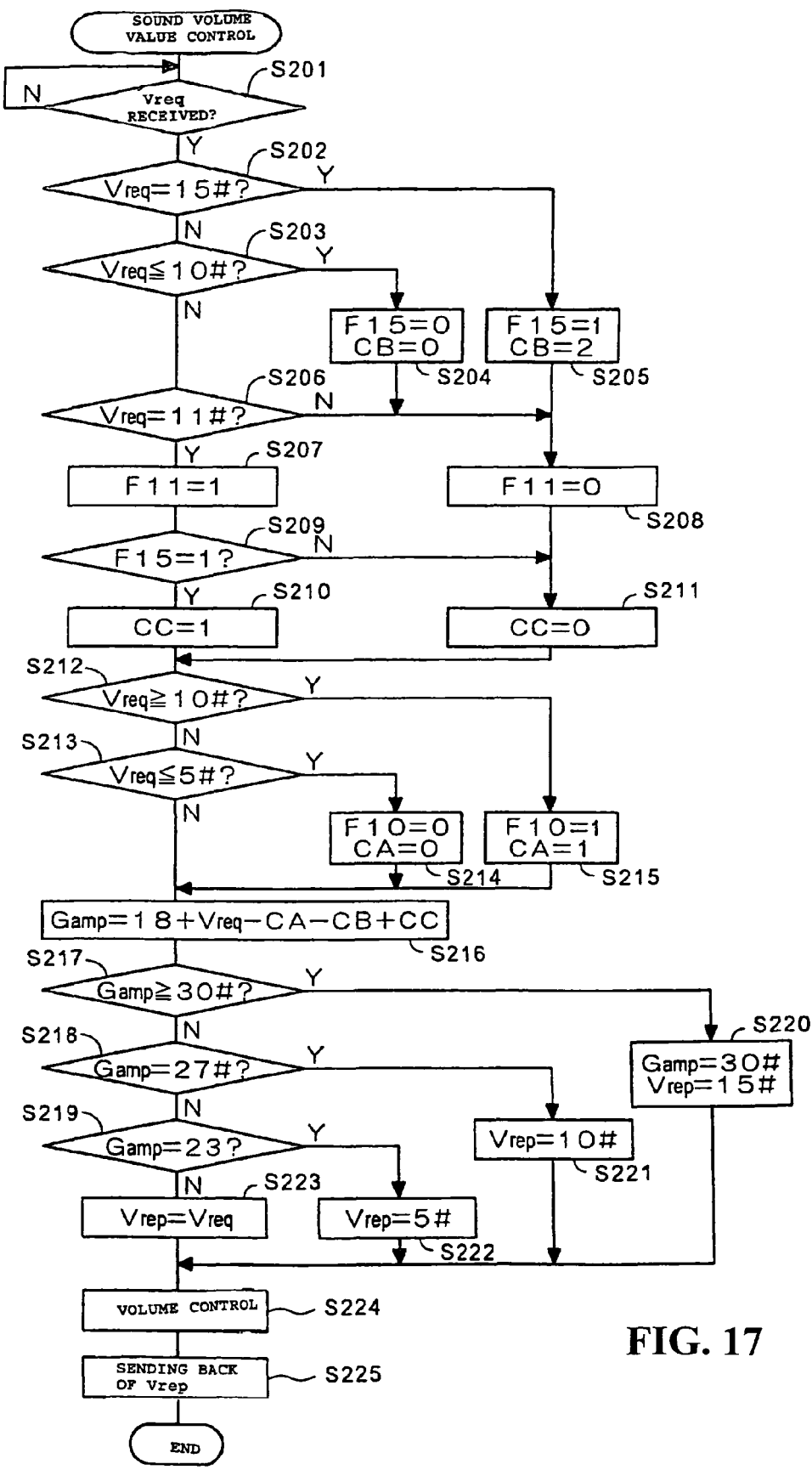
FIG. 17 is a flow chart (part 2) illustrating the operation of the third embodiment of the present invention.
Figure 19:
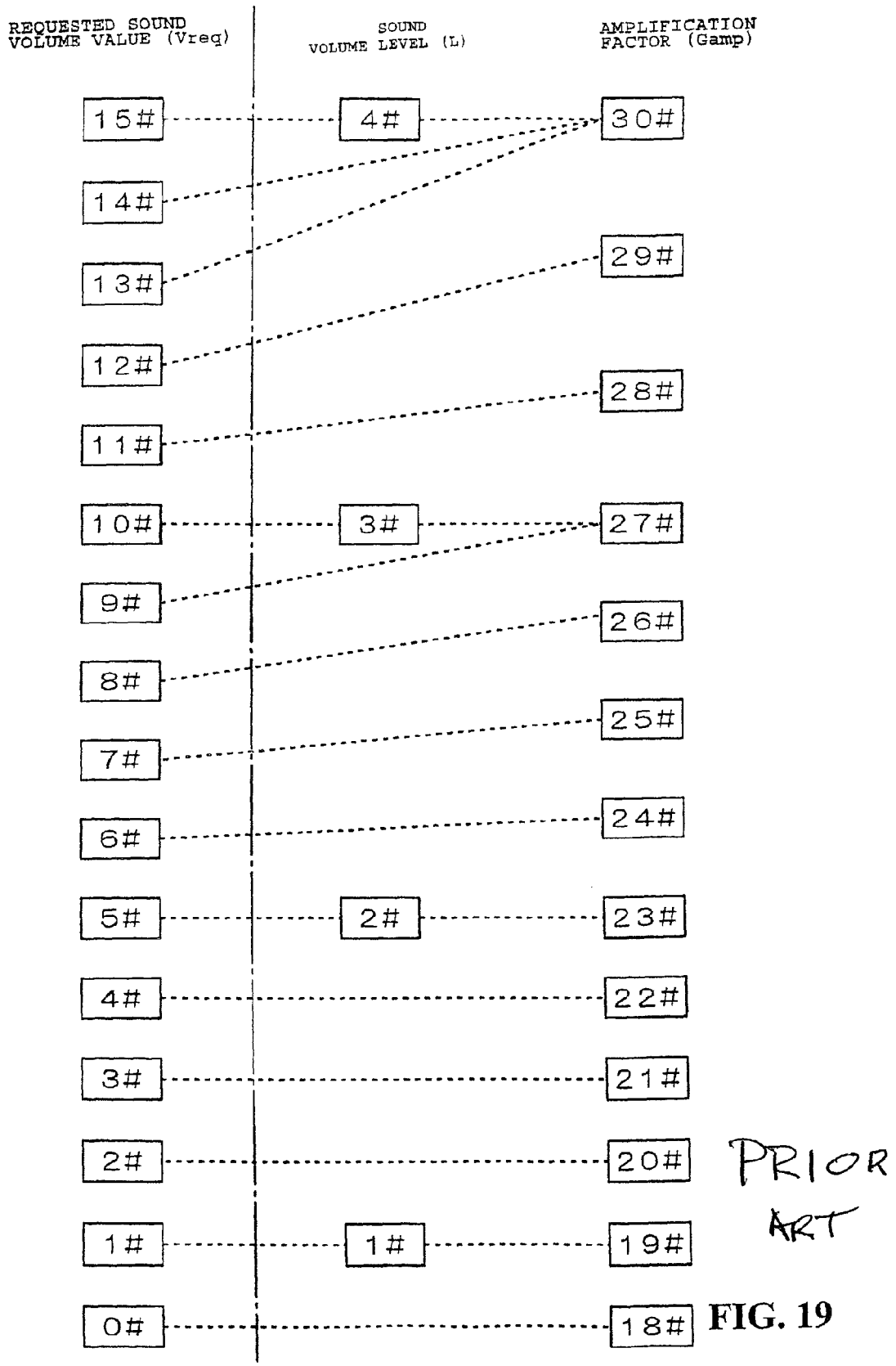
FIG. 19 is a view illustrating a subject of a related art.

FIGS. 16 and 17 are flow charts illustrating a procedure of the third embodiment wherein an amplification factor Gamp and an actual result sound volume value Vrep to be coordinated with an actual result sound volume value Vrep are determined by an arithmetic operation without using a data table. FIG. 18 is a view schematically illustrating a coordination relationship between the requested sound volume values Vreq and the amplification factors Gamp in the present embodiment.

Referring to FIG. 16, at step S20, three flags F10, F11 and F15 hereinafter described are initialized so as to be reset to "0". At step S21, sound volume value control for controlling the amplification factor of the digital potentiometer 371 based on a requested sound volume value Vreq received from the remote controller 14 is executed.

FIG. 17 is a flow chart illustrating a procedure of the sound volume value control. If a requested sound volume value Vreq transmitted from the remote controller 14 is received at step S201, then the requested sound volume value Vreq is referred to at steps S202 and S203. If Vreq=15#, then the processing advances to step S205, at which the flag F15 is set (=1) and "2" is registered into a variable CB. If Vreq ≦#, then the processing advances to step S204, at which the flag F15 is reset (=0) and "0" is registered into the variable CB. If 10#<Vreq<15#, then the processing advances to step S206 without updating the re-reading flag F15 and the variable CB.

At step S206, it is decided whether or not the received requested sound volume value Vreq is "11#", and if the received requested sound volume value Vreq is "11#", then the flag F11 is set at step S207. At step S209, the re-reading flag F15 is referred to, and if the re-reading flag F15 is in a set state, then the processing advances to step S210, at which "1" is registered into a variable CC. If the flag F15 is in a reset state, then the processing advances to step S211, at which "0" is registered into the variable CC. It is to be noted that, if it is decided at step S206 that the requested sound volume value Vreq is any other than "11#", then the processing advances to step S208, at which the flag F11 is reset.

At steps S212 and S213, the requested sound volume value Vreq is referred to. If Vreq≧10#, then the processing advances to step S215, at which the flag F10 is set (=1) and "1" is registered into a variable CA. If Vrep≦5#, then the processing advances to step S214, at which the flag F10 is reset (=0) and "0" is registered into the variable CA. If 5<Vrep<10#, then the processing advances to step S216 without updating the flag F10 and the variable CA. At step S216, the amplification factor Gamp of the digital potentiometer 371 is calculated provisionally in accordance with the following expression (1):

$$Gamp = 18\# + Vreq - CA - CB + CC \qquad (1)$$

At steps S217, S218 and S219, a result of the calculation of the amplification factor Gamp is referred to. If Gamp≧"30#", then the processing advances from step S217 to step S220, at which the amplification factor Gamp is limited to "30#" and the actual result sound volume value Vrep is set to "15#". If Gamp="27#", then the processing advances from step S218 to step S221, at which the actual result sound volume value Vrep is set to "10#". If Gamp="23#", then the processing advances from step S219 to step S222, at which the actual result sound volume value Vrep is set to "5#". At step S223, the actual result sound volume value Vrep is registered as it is as the actual result sound volume value Vrep in the present cycle.

At step S224, the digital potentiometer 371 is controlled based on the amplification factor Gamp. At step S224, the actual result sound volume value Vrep is sent back to the remote controller 14.

According to the present embodiment, since an actual result sound volume value Vrep and an amplification factor Gamp to be coordinated with a requested sound volume value Vreq are determined by arithmetic operation of a function, the memory capacity necessary to determine an actual result sound volume value and an amplification factor coordinated with a requested sound volume value can be saved when compared with those in the first and second embodiments.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An audio terminal including an electronic volume control apparatus which sets an amplification factor (Gamp) of a digital potentiometer in response to a requested sound volume value (Vreq) transmitted thereto from a remote controller, and the audio terminal sending an actual result sound volume value (Vrep) back to the remote controller in response to the requested sound volume value (Vreq), said electronic volume control apparatus comprising:
   storage means for defining a coordination relationship among M different requested sound volume values (Vreq) and M different actual result sound volume values (Vrep) as well as N (M≠N) different amplification factors (Gamp), each of the requested sound volume values (Vreq) and the amplification factors (Gamp) being a positive integer;
   means for receiving a requested sound volume value (Vreq) transmitted from said remote controller;
   means for searching for the amplification factor (Gamp) and the actual result sound volume value (Vrep) coordinated with the received requested sound volume value (Vreq) from within said storage means;
   means for controlling said potentiometer based on a result of the search of the amplification factor (Gamp); and
   responding means for sending the result of the search of the actual result sound volume value (Vrep) from the audio terminal back to the remote controller;
   said storage means including:
   means for coordinating a first requested sound volume value (Vreq), uniquely with a first predetermined amplification factor (Gamp), and a first predetermined actual result sound volume value (Vrep), and for coordinating each of successive requested sound volume values (Vreq) uniquely with successive amplification factors (Gamp) and successive actual result sound volume values (Vrep);
   ascending order coordination means for coordinating the amplification factors (Gamp) in an ascending order; and
   descending order coordination means for coordinating the amplification factors (Gamp) in a descending order,
   wherein said ascending order coordination means and said descending order coordination means are data tables in which coordination relationships of the requested sound volume values (Vreq), the actual result sound volume values (Vrep), and the amplification factors (Gamp) are different from each other, and
   since said coordination relationship of each of the requested sound volume values (Vreq) with the amplification factors (Gamp) and said actual result sound volume values (Vrep) is defined in the storage means,
   a load of a process for determining a specific one of the actual result sound volume values (Vrep), and a specific one of the amplification factors (Gamp) coordinated with each of the requested sound volume values (Vreq) received from said controller is minimized, and
   the specific actual result sound volume value (Vrep) produces a high fidelity sound output in a speaker of the audio terminal.

2. The audio terminal including an electronic volume control apparatus according to claim 1, wherein the requested sound volume values (Vreq) are used to coordinate the actual result sound volume value (Vrep) having a value different from the requested sound volume value (Vreq).

3. The audio terminal including an electronic volume control apparatus according to claim 1,
   wherein the first requested sound volume value (Vreq) is m, the first predetermined amplification factor (Gamp) is n, a variable increase in the first predetermined requested sound volume value (Vreq) is i, and a variable increase in the amplification factor (Gamp) is j; and
   wherein the ascending order coordination means is adapted to coordinate the amplification factors (Gamp) in an ascending order from the [n+1]th amplification factor (Gamp) with the [m+1]th to [m+i−1]th requested sound volume values (Vreq), to coordinate the actual result sound volume values (Vrep) in an ascending order from the [m+1]th actual result sound volume value (Vrep) with the [m+1]th to [m+i−1]th requested sound volume values (Vreq), and to uniformly coordinate the [n+j]th amplification factor (Gamp) and the [m+i]th actual result sound volume value (Vrep) with the remaining requested sound volume values (Vreq); and
   the descending order coordination means is adapted to coordinate the amplification factors (Gamp) in a descending order from the [n+j−1]th amplification factor (Gamp) with the [m+i−1]th to [m+1]th requested sound volume values (Vreq), to coordinate the actual result sound volume values (Vrep) in a descending order from the [m+i−1]th actual result sound volume value (Vrep) with the [m+i−1]th to [m+i]th requested sound volume values (Vreq), and to uniformly coordinate the nth amplification factor (Gamp) and the mth actual result sound volume value (Vrep) with the remaining requested sound volume values (Vreq); and
   the means for searching is adapted to compare, when any of the [m+1]th to [m+i−1]th requested sound volume values (Vreq) is received, a timing at which the mth actual result sound volume value (Vrep) is sent back last, and a timing at which the [m+i]th actual result sound volume value (Vrep) is sent back with each other, and is adapted to search said ascending order coordination means if the sending back timing of the mth actual result sound volume value (Vrep) is more recent, and alternatively to search said descending order coordination means if the sending back timing of the [m+i]th actual result sound volume value (Vrep) is more recent.

4. The audio terminal including an electronic volume control apparatus according to claim 1, wherein said storage means is a function whose parameters are the requested sound volume value (Vreq) in the present cycle, a history relating to the requested sound volume values (Vreq) in the preceding cycles and a set value unique to said potentiometer, and said search means determines the predetermined actual result sound volume value (Vrep) and the predetermined amplification factor (Gamp) to be coordinated with the requested sound volume value (Vreq) based on the function.

5. The audio terminal including an electronic volume control apparatus according to claim 2, wherein said storage means is a function whose parameters are the requested sound volume value (Vreq) in the present cycle, a history relating to the requested sound volume values (Vreq) in the preceding cycles and a set value unique to said potentiometer, and said search means determines the predetermined actual result sound volume value (Vrep) and the predetermined amplification factor (Gamp) to be coordinated with the requested sound volume value (Vreq) based on the function.

6. The audio terminal including an electronic volume control apparatus according to claim 1, wherein Bluetooth is provided as a transmission protocol for communicating said requested sound volume value (Vreq) from the remote controller.

7. The audio terminal including an electronic volume control apparatus according to claim 1, wherein three data tables are utilized.

8. An audio terminal including an electronic volume control apparatus for setting an amplification factor (Gamp) of a digital potentiometer in response to a requested sound volume value (Vreq) transmitted thereto from a remote controller, the audio terminal sending an actual result sound volume value (Vrep) back to the audio terminal in response to the requested sound volume value (Vreq), said electronic volume control apparatus comprising:
- a coordination relationship storage section for defining a coordination relationship among M different requested sound volume values (Vreq) and M different actual result sound volume values (Vrep) as well as N (M≠N) different amplification factors (Gamp), each of the requested sound volume values (Vreq) and the amplification factors (Gamp) being a positive integer;
- a receiver for receiving a requested sound volume value (Vreq) transmitted from said remote controller;
- locator for searching for the amplification factor (Gamp) and an actual result sound volume value (Vrep) coordinated with the received requested sound volume value (Vreq) from within said data tables;
- controller for controlling said potentiometer based on a result of the search of the amplification factor (Gamp); and
- a responder for sending the result of the search of the actual result sound volume value (Vrep) back to the remote controller;
- a coordinator for coordinating a first requested sound volume value (Vreq) uniquely with a first predetermined amplification factor (Gamp) and a first predetermined actual result sound volume value (Vrep), and for coordinating each of successive requested sound volume values (Vreq) uniquely with successive amplification factors (Gamp) and successive actual result sound volume values (Vrep);
- an ascending order coordinator for coordinating the amplification factors (Gamp) in an ascending order; and
- a descending order coordinator for coordinating the amplification factors (Gamp) in a descending order,
- wherein said ascending order coordinator and said descending order coordinator are data tables in which coordination relationships of the requested sound volume values (Vreq), the actual result sound volume values (Vrep), and the amplification factors (Gamp) are different from each other, and
- since said coordination relationship of each of the requested sound volume values (Vreq) with the amplification factors (Gamp) and said actual result sound volume values (Vrep) is defined in the storage section,
- a load of a process for determining a specific one of the actual result sound volume values (Vrep), and a specific one of the amplification factors (Gamp) coordinated with each of the requested sound volume values (Vreq) received from said controller is minimized, and
- the specific actual result sound volume value (Vrep) produces a high fidelity sound output in a speaker of the audio terminal.

9. The audio terminal including an electronic volume control apparatus according to claim 8, wherein the requested sound volume values (Vreq) are used to coordinate the actual result sound volume value (Vrep) having a value different from the requested sound volume value (Vreq).

10. The audio terminal including an electronic volume control apparatus according to claim 8,
- wherein the first requested sound volume value (Vreq) is m,
- the first predetermined amplification factor (Gamp) is n,
- a variable increase in the first predetermined requested sound volume value (Vreq) is I, and
- a variable increase in the amplification factor (Gamp) is j;
- the audio terminal further comprising
- means for coordinating the mth requested sound volume value (Vreq) uniquely with the nth amplification factor (Gamp) and the mth actual result sound volume value (Vrep) and coordinating the [m+i]th requested sound volume value (Vreq) uniquely with the [n+i]th (i>j) amplification factor (Gamp) and the [m+i]th actual result sound volume value (Vrep);
- wherein the ascending order coordination means is adapted to coordinate the amplification factors (Gamp) in an ascending order from the [n+1]th amplification factor (Gamp) with the [m+1]th to [m+i−1]th requested sound volume values (Vreq), to coordinate the actual result sound volume values (Vrep) in an ascending order from the [m+1]th actual result sound volume value (Vrep) with the [m+1]th to [m+i−1]th requested sound volume values (Vreq), and to uniformly coordinate the [n+j]th amplification factor (Gamp) and the [m+i]th actual result sound volume value (Vrep) with the remaining requested sound volume values (Vreq); and
- the descending order coordination means is adapted to coordinate the amplification factors (Gamp) in a descending order from the [n+j−1]th amplification factor (Gamp) with the [m+i−1]th to [m+1]th requested sound volume values (Vreq), to coordinate the actual result sound volume values (Vrep) in a descending order from the [m+i−1]th actual result sound volume value (Vrep) with the [m+i−1]th to [m+i]th requested sound volume values (Vreq), and to uniformly coordinate the nth amplification factor (Gamp) and the mth actual result sound volume value (Vrep) with the remaining requested sound volume values (Vreq); and
- the means for searching is adapted to compare, when any of the [m+1]th to [m+i−1]th requested sound volume values (Vreq) is received, a timing at which the mth actual result sound volume value (Vrep) is sent back last, and a timing at which the [m+i]th actual result sound volume value (Vrep) is sent back with each other, and is adapted to search said ascending order coordination means if the sending back timing of the mth actual result sound volume value (Vrep) is more recent, and alternatively to search said descending order coordination means if the sending back timing of the [m+i]th actual result sound volume value (Vrep) is more recent.

11. The audio terminal including an electronic volume control apparatus according to claim 8, wherein said data tables include the parameters of the requested sound volume value (Vreq) in the present cycle, a history relating to the requested sound volume values (Vreq) in the preceding cycles and a set value unique to said potentiometer, and said locator determines the predetermined actual result sound volume value (Vrep) and the predetermined amplification factor (Gamp) to be coordinated with the requested sound volume value (Vreq) based on the function.

12. The audio terminal including an electronic volume control apparatus according to claim 9, wherein said data tables include the parameters of the requested sound volume value (Vreq) in the present cycle, a history relating to the requested sound volume values (Vreq) in the preceding cycles and a set value unique to said potentiometer, and said locator determines the predetermined actual result sound volume value (Vrep) and the predetermined amplification factor (Gamp) to be coordinated with the requested sound volume value (Vreq) based on the function.

13. The audio terminal including an electronic volume control apparatus according to claim 10, wherein five data tables are utilized.

14. The audio terminal including an electronic volume control apparatus according to claim 10, wherein Bluetooth is provided as a transmission protocol for communicating said requested sound volume value (Vreq) from the remote controller.

15. A method for controlling an electronic volume in an electronic control apparatus of an audio terminal which sets an amplification factor (Gamp) of a digital potentiometer in response to a requested sound volume value (Vreq) transmitted thereto from a remote controller, and the audio terminal sending an actual result sound volume value (Vrep) back to the remote controller in response to the requested sound volume value (Vreq), said method comprising the following steps:

storing a coordination relationship among M different requested sound volume values (Vreq), M different actual result sound volume values (Vrep), and N (M≠N) different amplification factors (Gamp) in storage means), each of the requested sound volume values (Vreq) and the amplification factors (Gamp) being a positive integer;

receiving a requested sound volume value (Vreq) transmitted from a remote controller;

searching for the amplification factor (Gamp) and an actual result sound volume value (Vrep) coordinated with the received requested sound volume value (Vreq) from said storing step;

controlling said potentiometer based on a result of the search of the amplification factor (Gamp); and responding to send the result of the search of the actual result sound volume value (Vrep) back to the remote controller;

coordinating a first requested sound volume value (Vreq) uniquely with a first predetermined amplification factor (Gamp) and a first predetermined actual result sound volume value (Vrep) and coordinating each of successive requested sound volume values Vreq) uniquely with successive amplification factors (Gamp) and successive actual result sound volume value (Vrep);

coordinating the ascending order of the amplification factors (Gamp) in an ascending order, and coordinating the descending order of the amplification factors (Gamp) in a descending order by using data tables in which coordination relationships of the requested sound volume values (Vreq), the actual result sound volume values (Vrep), and the amplification factors (Gamp) are different from each other, and since said coordination relationship of each of the requested sound volume values (Vreq) with the amplification factors (Gamp) and said actual result sound volume values (Vrep) is defined in the storage means, a load of a process for determining a specific one of the actual result sound volume values (Vrep), and a specific one of the amplification factor (Gamp) coordinated with each of the requested sound volume values (Vreq) received from said controller is minimized, and the specific actual result sound volume value (Vrep) produces a high fidelity sound output in a speaker of the audio terminal.

16. The method according to claim 15, wherein the requested sound volume values (Vreq) are used to coordinate the predetermined actual result sound volume value (Vrep) having a value different from the requested sound volume value (Vreq).

17. The method according to claim 15, wherein the storing step is a function whose parameters are a requested sound volume value (Vreq) in the present cycle, a history relating to the requested sound volume values (Vreq) in the preceding cycles and a set value unique to said potentiometer, and said searching step determines an actual result sound volume value (Vrep) and the predetermined amplification factor (Gamp) to be coordinated with the requested sound volume value (Vreq) based on the function.

* * * * *